(12) United States Patent
Agarwal et al.

(10) Patent No.: US 11,949,764 B2
(45) Date of Patent: *Apr. 2, 2024

(54) COMPRESSING DIGITAL METRICS FOR TRANSMISSION ACROSS A NETWORK UTILIZING A GRAPH-BASED COMPRESSION DICTIONARY AND TIME SLICE DELTA COMPRESSION

(71) Applicant: Bitdrift, Inc., San Francisco, CA (US)

(72) Inventors: Kirti Agarwal, Wood Ridge, CA (US); Behrooz Badii, Westport, CT (US); Nathaniel Joseph Oorloff, Brooklyn, NY (US); Jeffrey Tsvi Pinner, Tiburon, CA (US); Yann Thomas Ramin, Folsom, CA (US)

(73) Assignee: Bitdrift, Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/047,880

(22) Filed: Oct. 19, 2022

(65) Prior Publication Data

US 2023/0060276 A1    Mar. 2, 2023

Related U.S. Application Data

(63) Continuation of application No. 17/932,882, filed on Sep. 16, 2022, which is a continuation of application
(Continued)

(51) Int. Cl.
*G06F 15/16* (2006.01)
*H04L 69/04* (2022.01)
(Continued)

(52) U.S. Cl.
CPC ............. *H04L 69/04* (2013.01); *H04L 47/38* (2013.01); *H04L 51/06* (2013.01)

(58) Field of Classification Search
None
See application file for complete search history.

(56) References Cited

U.S. PATENT DOCUMENTS

| 8,018,866 B1 | 9/2011 | Kasturi et al. |
| 9,143,393 B1 | 9/2015 | Bird et al. |

(Continued)

FOREIGN PATENT DOCUMENTS

| CN | 101311930 A | 11/2008 |
| CN | 101311930 B | 7/2012 |

(Continued)

OTHER PUBLICATIONS

Graphite—Scalable Realtime Graphing. http://graphite.wikidot.com/. Accessed Mar. 20, 2015.
(Continued)

*Primary Examiner* — Phyllis A Book
(74) *Attorney, Agent, or Firm* — Lee Sullivan Shea & Smith LLP

(57) ABSTRACT

The present disclosure relates to systems, methods, and non-transitory computer-readable media that generate compressed metric data for digital metrics utilizing a graph-based compression dictionary and time slice compression. For instance, the disclosed systems can utilize a dynamically modifiable graph-based compression dictionary to generate compressed metric label identifiers for metric labels of digital metrics. The graph-based compression dictionary can include nodes and edges corresponding to metric label segments and metric label identifier values, respectively. The disclosed systems can traverse the graph-based compression dictionary using a metric label to determine the corresponding compressed metric label identifier. The disclosed systems can further generate delta compression values for the metric values of the digital metrics. For instance, the disclosed systems can compare metric values within a
(Continued)

single time slice (e.g., a time stamp) to generate corresponding delta compression values. In some cases, the disclosed systems further compare the metric values across a time window.

20 Claims, 14 Drawing Sheets

Related U.S. Application Data

No. 17/410,921, filed on Aug. 24, 2021, now Pat. No. 11,463,559.

(51) Int. Cl.
*H04L 47/38* (2022.01)
*H04L 51/06* (2022.01)

(56) References Cited

U.S. PATENT DOCUMENTS

| | | | |
|---|---|---|---|
| 2005/0232504 A1 | 10/2005 | Suzuki et al. | |
| 2008/0077607 A1* | 3/2008 | Gatawood | G06F 16/215 |
| 2008/0240226 A1 | 10/2008 | Okmianski et al. | |
| 2009/0157712 A1 | 6/2009 | De Peuter et al. | |
| 2011/0313980 A1 | 12/2011 | Faerber et al. | |
| 2012/0150877 A1* | 6/2012 | Ramamurthy | G06F 16/20 |
| | | | 707/E17.104 |
| 2012/0191670 A1 | 7/2012 | Kennedy et al. | |
| 2012/0265723 A1 | 10/2012 | Arndt et al. | |
| 2013/0018889 A1 | 1/2013 | Jagmohan et al. | |
| 2013/0254197 A1* | 9/2013 | Hay | H04L 43/028 |
| | | | 707/736 |
| 2014/0149605 A1 | 5/2014 | Annamalaisami et al. | |
| 2015/0032757 A1 | 1/2015 | Barykin et al. | |
| 2015/0178305 A1 | 6/2015 | Mueller et al. | |
| 2015/0347426 A1 | 12/2015 | Dickie et al. | |
| 2016/0204799 A1* | 7/2016 | Ackerman | G06F 16/2456 |
| | | | 341/51 |
| 2016/0246811 A1* | 8/2016 | Ackerman | G06F 16/1744 |
| 2016/0381188 A1 | 12/2016 | Fekri et al. | |
| 2017/0004158 A1* | 1/2017 | Faerber | G06F 16/24553 |
| 2017/0031944 A1 | 2/2017 | Faerber et al. | |
| 2017/0279932 A1 | 9/2017 | Schurman et al. | |
| 2018/0039902 A1 | 2/2018 | Jeffries | |
| 2018/0139458 A1 | 5/2018 | Wang et al. | |
| 2018/0173372 A1 | 6/2018 | Greenspan et al. | |
| 2019/0138927 A1* | 5/2019 | Jeffries | H03M 7/70 |
| 2019/0155925 A1* | 5/2019 | Giannikis | G06F 16/221 |
| 2020/0073868 A1* | 3/2020 | Delamare | H03M 7/707 |
| 2020/0250193 A1 | 8/2020 | Pham et al. | |
| 2020/0274550 A1* | 8/2020 | St. John | H03M 7/6023 |
| 2021/0034598 A1* | 2/2021 | Arye | G06F 16/288 |
| 2021/0119641 A1* | 4/2021 | Alligand | H03M 7/4031 |
| 2021/0152364 A1* | 5/2021 | Beecham | G06F 16/9024 |
| 2021/0160080 A1 | 5/2021 | Struttmann et al. | |

FOREIGN PATENT DOCUMENTS

| | | | |
|---|---|---|---|
| CN | 101311930 B | 7/2012 | |
| CN | 111782660 A * | 10/2020 | G06F 11/3409 |
| WO | 2019152346 A1 | 8/2019 | |

OTHER PUBLICATIONS

Influxdb.com: InfluxDB—Open Source Time Series, Metrics, and Analytics Database. http://influxdb.com/. Accessed Mar. 20, 2015.
L. Abraham, J. Allen, O. Barykin, V. R. Borkar, B. Chopra, C. Gerea, D. Merl, J. Metzler, D. Reiss, S. Subramanian, J. L. Wiener, and O. Zed. Scuba: Diving into Data at Facebook. PVLDB, 6(11):1057-1067, 2013.
E. B. Boyer, M. C. Broomfield, and T. A. Perrotti. GlusterFS One Storage Server to Rule Them All. Technical report, Los Alamos National Laboratory (LANL), 2012.
N. Bronson, T. Lento, and J. L. Wiener. Open Data Challenges at Facebook. In Workshops Proceedings of the 31st International Conference on Data Engineering Workshops, ICDE Seoul, Korea. IEEE, 2015.
T. D. Chandra, R. Griesemer, and J. Redstone. Paxos Made Live: An Engineering Perspective. In Proceedings of the twenty-sixth annual ACM symposium on Principles of distributed computing, pp. 398-407. ACM, 2007.
H. Chen, J. Li, and P. Mohapatra. RACE: Time Series Compression with Rate Adaptivity and Error Bound for Sensor Networks. In Mobile Ad-hoc and Sensor Systems, 2004 IEEE International Conference on, pp. 124-133. IEEE, 2004.
B. Hu, Y. Chen, and E. J. Keogh. Time Series Classification under More Realistic Assumptions. In SDM, pp. 578-586, 2013.
E. Keogh, K. Chakrabarti, M. Pazzani, and S. Mehrotra. Locally Adaptive Dimensionality Reduction for Indexing Large Time Series Databases. ACM SIGMOD Record, 30(2):151-162, 2001.
E. Keogh, S. Lonardi, and B.-c. Chiu. Finding Surprising Patterns in a Time Series Database in Linear Time and Space. In Proceedings of the eighth ACM SIGKDD international conference on Knowledge discovery and data mining, pp. 550-556. ACM, 2002.
E. Keogh, S. Lonardi, and C. A. Ratanamahatana. Towards Parameter-Free Data Mining. In Proceedings of the tenth Acm Sigkdd international conference on Knowledge discovery and data mining, pp. 206-215. ACM, 2004.
E. Keogh and C. A. Ratanamahatana. Exact Indexing of Dynamic Time Warping. Knowledge and information systems, 7(3):358-386, 2005.
I. Lazaridis and S. Mehrotra. Capturing Sensor-Generated Time Series with Quality Guarantees. In Data Engineering, 2003. Proceedings. 19th International Conference on, pp. 429-440. IEEE, 2003.
Leslie Lamport. Paxos Made Simple. SIGACT News, 32(4):51-58, Dec. 2001.
J. Lin, E. Keogh, S. Lonardi, and B. Chiu. A Symbolic Representation of Time Series, with Implications for Streaming Algorithms. In Proceedings of the 8th ACM SIGMOD workshop on Research issues in data mining and knowledge discovery, pp. 2-11. ACM, 2003.
J. Lin, E. Keogh, S. Lonardi, J. P. Lankford, and D. M. Nystrom. Visually Mining and Monitoring Massive Time Series. In Proceedings of the tenth ACM SIGKDD international conference on Knowledge discovery and data mining, pp. 460-469. ACM, 2004.
P. Lindstrom and M. Isenburg. Fast and Efficient Compression of Floating-Point Data. Visualization and Computer Graphics, IEEE Transactions on, 12(5):1245-1250, 2006.
A. Mueen, S. Nath, and J. Liu. Fast Approximate Correlation for Massive Time-Series Data. In Proceedings of the 2010 ACM SIGMOD International Conference on Management of data, pp. 171-182. ACM, 2010.
R. Nishtala. Learning from Mistakes and Outages. Presented at SREcon, Santa Clara, CA, Mar. 2015.
R. Nishtala, H. Fugal, S. Grimm, M. Kwiatkowski, H. Lee, H. C. Li, R. McElroy, M. Paleczny, D. Peek, P. Saab, et al. Scaling Memcache at Facebook. In nsdi, vol. 13, pp. 385-398, 2013.
J. Parikh. Keynote speech. Presented at @Scale Conference, San Francisco, CA, Sep. 2014.
K. Pearson. Note on regression and inheritance in the case of two parents. Proceedings of the Royal Society of London, 58(347-352):240-242, 1895.
F. Petitjean, G. Forestier, G. Webb, A. Nicholson, Y. Chen, and E. Keogh. Dynamic Time Warping Averaging of Time Series Allows Faster and More Accurate Classification. In IEEE International Conference on Data Mining, 2014.
T. Rakthanmanon, B. Campana, A. Mueen, G. Batista, B. Westover, Q. Zhu, J. Zakaria, and E. Keogh. Searching and Mining Trillions of Time Series Subsequences Under Dynamic Time Warping. In Proceedings of the 18th ACM SIGKDD international conference on Knowledge discovery and data mining, pp. 262-270. ACM, 2012.
P. Ratanaworabhan, J. Ke, and M. Burtscher. Fast Lossless Compression of Scientific Floating-Point Data. In DCC, pp. 133-142. IEEE Computer Society, 2006.

(56) References Cited

OTHER PUBLICATIONS

A. Thusoo, J. S. Sarma, N. Jain, Z. Shao, P. Chakka, S. Anthony, H. Liu, P. Wyckoff, and R. Murthy. Hive: A Warehousing Solution Over a Map-Reduce Framework. PVLDB, 2(2):1626-1629, 2009.
T. W. Wlodarczyk. Overview of Time Series Storage and Processing in a Cloud Environment. In Proceedings of the 2012 IEEE 4th International Conference on Cloud Computing Technology and Science (CloudCom), pp. 625-628. IEEE Computer Society, 2012.
Wikipedia: The Free Encyclopedia; "Finite-state transducer"; Date downloaded Oct. 12, 2021.
2-Dimensional Line Graph Examples: SIMS Sensory Quality Panel Software Cloud Systems—Evaluation Testing Software Systems; Date downloaded Oct. 12, 2021.
International Search Report & Written Opinion as received in PCT/US2022/075201 dated Dec. 21, 2022.
U.S. Appl. No. 17/410,921, dated Jun. 10, 2022, Notice of Allowance.

\* cited by examiner

| Compression Method | Resulting Size | Compression Ratio |
|---|---|---|
| No Compression | 2517 kb | 0% |
| Gzip (Default) | 375 kb | 85.1% |
| Zstd (Default) | 341 kb | 86.45% |
| Snappy Encoded Protobuf | 755 kb | 70% |
| Metric Compression System (no labels sent with packet, everything in pre-shared lookup table) | 43 kb | 98.29% |
| Metric Compression System (10% metric labels sent) | 71 kb | 97.18% |
| Metric Compression System (all metric labels sent in packet) | 305 kb | 87.88% |

*Fig. 7*

COMPRESSING DIGITAL METRICS FOR TRANSMISSION ACROSS A NETWORK UTILIZING A GRAPH-BASED COMPRESSION DICTIONARY AND TIME SLICE DELTA COMPRESSION

CROSS-REFERENCE TO RELATED APPLICATION

The present application is a continuation of U.S. application Ser. No. 17/932,882, filed on Sep. 16, 2022, which is a continuation of U.S. application Ser. No. 17/410,921, filed on Aug. 24, 2021. The aforementioned applications are hereby incorporated by reference in their entirety.

BACKGROUND

Recent years have seen significant advancement in hardware and software platforms that perform digital data compression. For instance, various computing systems implement some form of analytics to monitor and improve the performance and health of a product or service across a computer network. As these analytics become more sophisticated, the quantity of digital data that is generated, stored, and communicated between different computing devices—often in the form of metric values or associated metadata—grows significantly. Accordingly, many computing systems utilize digital data compression to reduce the size of the digital data that is communicated and/or stored. Despite these advances, however, conventional metric compression systems suffer from several technological shortcomings that result in inflexible and inefficient operation.

SUMMARY

One or more embodiments described herein provide benefits and/or solve one or more of the foregoing or other problems in the art with systems, methods, and non-transitory computer-readable media that utilize a graph-based compression dictionary and time slice compression to flexibly and efficiently compress metric data. For instance, in one or more embodiments, the disclosed systems utilize a graph-based compression dictionary consisting of nodes and edges, such as a finite state transducer, to generate compressed values for metadata labels corresponding to metrics. The disclosed systems can update the graph-based compression dictionary by adding and/or removing nodes and edges corresponding to metric changes. Further, the disclosed systems can perform compression on the metric values themselves—such as by implementing delta compression across all metric values represented within a given time slice. In some implementations, the disclosed systems compress the metric values both across a window of time and across values within the same time instance. In this manner, the disclosed systems utilize more flexible and efficient compression tools for both server-to-server compression (e.g., in compressing data metric batches for individual time periods transmitted between servers) and/or server-to-client compression (e.g., in compressing time-series data transmitted to client devices for display). Further, the disclosed systems more flexibly and efficiently compress metric data for storage and transmission across a network.

Additional features and advantages of one or more embodiments of the present disclosure are outlined in the following description.

BRIEF DESCRIPTION OF THE DRAWINGS

This disclosure will describe one or more embodiments of the invention with additional specificity and detail by referencing the accompanying figures. The following paragraphs briefly describe those figures, in which:

FIG. 7 illustrates a table reflecting experimental results regarding the effectiveness of the metric compression system in accordance with one or more embodiments;

DETAILED DESCRIPTION

Figure 1:
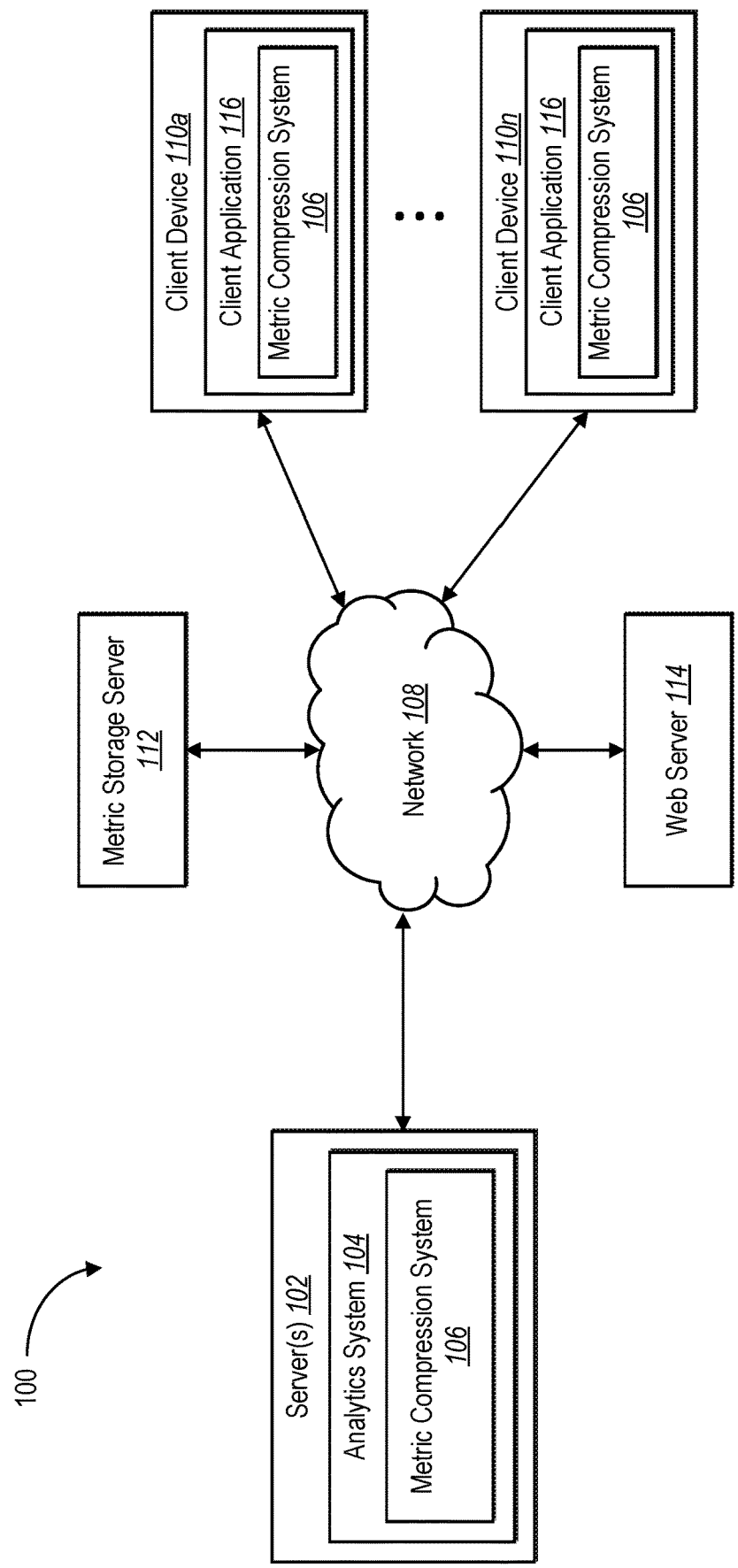
FIG. 1 illustrates an example environment in which a metric compression system can operate in accordance with one or more embodiments.

One or more embodiments described herein include a metric compression system that flexibly and efficiently compresses values of metrics using delta compression and compresses labels of the metrics using a graph-based compression dictionary. Indeed, in one or more embodiments, the metric compression system shares a graph-based compression dictionary between various computing devices. The graph-based compression dictionary can include nodes corresponding to segments of metadata labels and edges corresponding to compression values. The metric compression system can traverse the graph-based compression dictionary to generate compressed values to be transmitted among the various computing devices. Further, the metric compression system can perform time slice compression of the values of the metrics by determining delta comparisons of the values within a given time slice (e.g., time stamp). In some implementations, the metric compression system further performs compression by determining delta comparisons of the values across a window of time. Accordingly, the metric compression system can operate to compress digital metric data batches for individual time periods (e.g., for data metric updates at a specific time transmitted between servers) and/or to compress digital metric time series data (e.g., for a set of data metrics over time transmitted to client devices for display as part of a digital dashboard or report).

To provide an illustration, in one or more embodiments, the metric compression system generates a set of compressed metric data from a set of digital metrics that includes a plurality of metric values and a plurality of metric labels (e.g., label-value pairs). In particular, the metric compression system generates the set of compressed metric data by generating, utilizing a graph-based compression dictionary shared between a first computing device and a second computing device, compressed metric label identifiers based on the plurality of metric labels. Further, the metric compression system sorts the set of digital metrics in a sequence based on the plurality of metric values and generates delta compression values according to the sequence using the sorted plurality of metric values. The metric compression system can transmit the set of compressed metric data comprising the compressed metric label identifiers and the delta compression values from the first computing device to the second computing device across a network.

As just mentioned, in one or more embodiments, the metric compression system generates compressed metric data from a set of digital metrics. In particular, the metric compression system generates compressed metric label identifiers from the metric labels represented in the set of digital metrics. Further, the metric compression system generates delta compression values from the metric values represented in the set of digital metrics. Accordingly, the metric compression system can generate the compressed metric data to represent the set of digital metrics in a reduced format (e.g., fewer bits) that consumes less resources when stored and/or transmitted across a network.

In one or more embodiments, the metric compression system utilizes a graph-based compression dictionary to generate compressed metric label identifiers from the metric labels of the digital metrics. To illustrate, in some cases, a graph-based compression dictionary includes a plurality of nodes that correspond to metric label segments. Further, the graph-based compression dictionary includes a plurality of edges between the nodes that correspond to metric label identifier values. Accordingly, the metric compression system can generate a compressed metric label identifier for a metric label by traversing the nodes of the graph-based compression dictionary using the segments of the metric label and identifying the metric label identifier values that correspond to the edges between the traversed nodes.

In some implementations, the metric compression system updates the graph-based compression dictionary by modifying its nodes and/or edges. For instance, the metric compression system can add nodes and edges for metric label segments that correspond to digital metrics that were previously unrepresented in the graph-based compression dictionary (e.g., were previously not tracked). Likewise, the metric compression system can delete nodes and edges for metric label segments that correspond to digital metrics that were represented but are no longer to be represented.

In some cases, the metric compression system shares the graph-based compression dictionary with one or more computing devices (e.g., servers, client devices, etc.). To keep the graph-based compression dictionary synced with the computing device(s), the metric compression system can transmit, to the computing device(s), a dictionary update that indicates the nodes and edges that are to be added and/or deleted. In some embodiments, the metric compression system can receive, from the computing device(s), a dictionary update and modify the graph-based compression dictionary by adding and/or deleting the nodes and edges indicated therein.

As mentioned above, in one or more embodiments, the metric compression system compresses the metric values of the digital metrics by generating delta compression values. In some implementations, the metric compression system generates delta compression values for metric values corresponding to a particular time period (e.g., each digital metric from the set of digital metrics has a metric value that is associated with the same time stamp). For instance, the metric compression system can sort the digital metrics into a sequence based on the metric values (e.g., sorts the metric values into an ascending or descending order). The metric compression system can further generate the delta compression values based on value differences between pairs of metric values in the sequence. To illustrate, for a given metric value, the metric compression system can determine a corresponding delta compression value based on a value difference between the metric value and a preceding metric value in the sequence. Accordingly, in some embodiments the metric compression system applies delta compression across the metric namespace (in addition to, or in the alternative to, applying delta compression across time).

In some implementations, the metric compression system generates delta compression values for metric values that span a window of time (e.g., each digital metric from the set of digital metrics has several metric values associated with different time periods or time stamps). Accordingly, in one or more embodiments, the metric compression system generates delta compression values based on differences between the metric values across the time window. To illustrate, in one or more cases, the metric compression system generates delta compression values for the digital metrics by determining, for each digital metric, value differences between pairs of metric values across the window of time. In some cases, the metric compression system further determines additional delta compression values for the digital metrics by determining value differences between pairs of delta compression values corresponding to the same time stamp (e.g., for each time stamp within the time window).

In one or more embodiments, the metric compression system compresses other metric-related data. For instance, in some cases, the metric compression system generates a metric blocklist that indicates digital metrics that are not to be stored or transmitted across a network. In particular, the metric blocklist can include the metric labels of the digital metrics. In some implementations, the metric compression system generates a compressed metric blocklist (e.g., using the graph-based compression dictionary) that includes compressed metric label identifiers corresponding to those metric labels represented in the metric blocklist.

As mentioned above, conventional metric compression systems suffer from several technological shortcomings that result in inflexible and inefficient operation. For instance, conventional metric compression systems are often inflexible in that they compress metric metadata using rigid compression tools. To illustrate, many conventional systems utilize a compression dictionary—such as a hash map or a lookup table—to transform metric metadata into a compressed value. These compression dictionaries are often static, requiring replacement to change the metric metadata that can be processed and/or the compressed values that can be generated. As another example, many conventional systems rigidly compress metric values temporally. Accordingly, such conventional systems are typically limited to compressing the metric values of a given metric across a time window.

In addition to flexibility concerns, conventional metric compression systems are also often inefficient. To illustrate, compression dictionaries utilized by many conventional systems are large, demanding a significant amount of computing memory to store and a significant amount of computer processing to implement. Further, these compression dictionaries are often shared between various computing devices to ensure consistency in compression and to further facilitate decoding of the compressed values. Because they often must be replaced entirely to modify the metric labels and/or compressed values represented therein, conventional systems utilizing these compression dictionaries tend to consume significant bandwidth in transmitting the updated compression dictionaries among computing devices. Additionally, by limiting the compression of metric values to a temporal compression, conventional systems often produce compressed metric values of a size that still require a significant amount of processing power as well as computing memory and bandwidth to store and transmit.

The metric compression system provides several advantages over conventional systems. For instance, the metric compression system operates more flexibly than conventional systems. Indeed, by utilizing a graph-based compression dictionary to generate compressed metric label identifiers, the metric compression system implements more flexible compression tools. For example, the metric compression system can dynamically modify the graph-base compression dictionary by adding and/or removing particular nodes and edges, rather than replacing the graph-based compression dictionary entirely. Additionally, by determining delta compression values for metric values associated with the same time stamp, the metric compression system provides more flexible compression of digital metrics.

Additionally, the metric compression system operates more efficiently than conventional systems. For example, the graph-based compression dictionary implemented by the metric compression system is more compact (e.g., data efficient) when compared to the hash maps and lookup tables used by conventional systems. Accordingly, the metric compression system can traverse the graph-based compression dictionary to generate compressed metric label identifiers more quickly and with less demands on computer processing. Further, as the graph-based compression dictionary can be dynamically updated, the metric compression system reduces processing and bandwidth demands by transmitting, to the other computing devices with which the graph-based compression dictionary is shared, compact dictionary updates that indicate specific nodes and edges to add or delete. Further, by compressing metric values associated with the same time stamp (e.g., as an alternative or in addition to temporal compression), the metric compression system generates more efficient (e.g., smaller) compressed metric data, reducing the processing power as well as the memory or bandwidth required to store or transmit the compressed metric data.

As illustrated by the foregoing discussion, the present disclosure utilizes a variety of terms to describe features and benefits of the metric compression system. Additional detail is now provided regarding the meaning of these terms. For example, as used herein, the term "digital metric" refers to digital information that is transferable over a computing network. In one or more embodiments, a digital metric is organized into a data structure including a metric label (e.g., a name) and one or more metric values (e.g., tags) associated with that name (e.g., a key-value pair). In some embodiments, digital metrics are stored within a time-series database (e.g., key-value pairs where the value changes across time). For example, the metric label and/or metric value(s) associated with a digital metric can include alpha-numeric characters, strings, Boolean values, hash values, and so forth. In one or more embodiments, a digital metric is associated with a metric type. For example, a digital metric can be a gauge (e.g., current CPU load), a counter (e.g., a number of transportation requests), or a timer (e.g., latency of last request). Some examples of common digital metrics include, but are not limited to: CPU usage (e.g., a label referencing usage with a corresponding usage value), memory usage, file disk usage.

As mentioned above, a digital metric can include a metric label. As used herein, the term "metric label" refers to a label or identifier associated with a digital metric. In particular, a metric label can refer to a digital metric name, title, or description that uniquely identifies a digital metric or tags or dimensions associated with the digital metric. For example, in some instances, a metric label refers to a string of letters, numbers, and/or other characters, such as periods, dashes, slashes, etc. In some implementations, a metric label includes hierarchical or other relational information. In one or more embodiments, a metric label includes one or more segments. As used herein the term "segment" (or "metric label segment") refers to a portion of a metric label. In particular, a segment can refer to a subset of the string of letters, numbers, and/or other characters that make up a metric label. For example, a segment can include a substring of letters, numbers, and/or other characters that, when used in combination with other such substrings, represents a metric label.

Additionally, as mentioned above, a digital metric can include one or more metric values. As used herein, the term "metric value" refers to a parameter, value, measure, or state of a digital metric. In particular, a metric value can refer to a set of letters, numbers, and/or other characters that indicate the parameter, value, measure, or state of the digital metric at a particular time stamp. For instance, a metric value can include one or more numbers indicating a quantitative measurement corresponding to the digital metric. In some cases, a metric value includes a string of characters that provide a qualitative measurement (indicating that the digital metric is associated with one of a limited number of qualitative states). In some cases, a digital metric has a single metric value for a given time stamp. In some implementations, a digital metric has multiple metric values for a given time step. Further, in some embodiments, the metric value(s) of a digital metric can change across time.

As used herein, the term "compressed metric data" refers to compressed digital information that corresponds to one or more digital metrics. In particular, compressed metric data can refer to representations of digital metrics that are smaller (e.g., include fewer bits) than the raw representations of the digital metrics (e.g., the representations of the digital metrics that are used in analysis). For instance, compressed metric data that corresponds to a given digital metric can include one or more sets of bits that provide an abbreviated or encoded representation of the digital metric. Compressed metric data can include compressed metric label identifiers and delta compression values for the corresponding digital metrics.

Additionally, as used herein, the term "compressed metric label identifier" includes a compressed representation of a metric label. In particular, a compressed metric label identifier can refer to a value or set of values that uniquely identifies a metric label using less data (e.g., fewer bits) than the full representation of the metric label. For instance, a compressed metric label identifier can include one or more metric label identifier values. As used herein, the term "metric label identifier value" includes a value that represents a portion of a metric label. In particular, a metric label identifier value can refer to a value that represents a segment of a metric label. To illustrate, a metric label identifier value can include a letter, a number, or another character that corresponds to a segment of a metric label. In some instances, a metric label identifier value uniquely identifies a corresponding metric label segment based on its value and/or based on its position within the compressed metric label identifier. In some instances, a metric label identifier value includes multiple digits (e.g., multiple letters, numbers, and/or other characters).

Further, as used herein, the term "delta compression value" includes a compressed representation of a metric value based on a comparison with another metric value. In particular, a delta compression value can refer to a value or set of values that represents a change between two metric values and identified using less data (e.g., fewer bits) than the full representation of the metric value. In some implementations, a delta compression value represents the corresponding metric value by indicating the difference between the metric value and another metric value (e.g., an adjacent metric value, such as a preceding metric value in a sorted list or a metric value associated with a preceding time stamp). Accordingly, in some cases, a delta compression value includes a single bit (e.g., representing no difference) or multiple bits (representing the difference). Relatedly, as used herein, the term "value difference" refers to the difference in value between two metric values. For instance, a value difference can refer to the difference between the bit representations of a pair of metric values (e.g., 64-bit floating point number representations, etc.). To illustrate, a value difference can include the value difference determined using a logical operation, such as the XOR operation. In some implementations, however, the metric compression system determines the value difference by subtracting the numerical representation of one metric value from the numerical representation of another metric value.

As used herein, the term "graph-based compression dictionary" refers to a graph-based map for generating compressed metric label identifiers from metric labels. In particular, a graph-based compression dictionary includes a map that identifies a compressed metric label identifier for a metric label based on traversal of the map. To illustrate, a graph-based compression dictionary can include a plurality of nodes and a plurality of edges. The nodes can correspond to different metric label segments and the edges can correspond to metric label identifier values. Accordingly, the metric compression system can traverse the nodes of the graph-based compression dictionary based on the segments of a metric label and identify metric label identifier values for use in generating the corresponding compressed metric label identifier. In one or more embodiments, a graph-based compression dictionary includes a finite-state machine, such as a finite-state transducer. More detail regarding the graph-based compression dictionary and its use will be provided below.

As used herein, the term "dictionary update" refers to information regarding modifications to a graph-based compression dictionary. In particular, a dictionary update can refer to a communication between computing devices (e.g., computing devices between which a graph-based compression dictionary has been shared) that instructs the receiving computing device to make particular changes to the graph-based compression dictionary. For instance, a dictionary update can include one or more nodes and edges to be added to the graph-based compression dictionary. A dictionary update can additionally or alternatively include one or more nodes and edges to be deleted from the graph-based compression dictionary.

Additionally, as used herein, the term "metric blocklist" refers to a data structure that identifies digital metric requests to control. For example, a metric blocklist can indicate one or more digital metrics to block, filter, or prevent. For instance, a metric blocklist can include a list, array, string, or vector referencing digital metrics predicted to go unutilized by one or more computing devices. For example, in one embodiment, the metric compression system generates a metric blocklist as a comma separated file including metric labels of digital metrics whose associated requests should be blocked. In other embodiments, the metric compression system generates a metric blocklist as a hash map, a linked list, or any other suitable data structure. Although referred to in terms of a "blocklist" for blocking digital metrics, a metric blocklist also includes a list of digital metrics to allow. In other words, even if implemented as a list of digital metrics to allow, the term blocklist still encompasses this implementation as a data structure that identifies digital metric requests to control. Indeed, in some implementations, the metric compression system implements a metric blocklist to indicate digital metrics to be archived, batched, or buffered and/or deleted within some time frame.

The metric compression system can distribute a metric blocklist to one or more computing devices. Relatedly, as used herein, the term "compressed metric blocklist" refers to a compressed representation of a metric blocklist. In particular, a compressed metric blocklist can refer to a set of values that represent the metric labels included in a metric blocklist in a reduced format. For instance, in some cases, a compressed metric blocklist includes a list, array, string, or vector of compressed metric label identifiers representing the metric labels in the corresponding metric blocklist.

Further, as used herein, the term "window of time" (or "time window") refers to a period of time (e.g., that includes a period ranging multiple time stamps). In particular, a window of time can refer to a period spanning a sequence of consecutive time stamps. To illustrate, a window of time can include a group of time stamps that is delineated by a beginning time stamp and an ending time stamp and includes all time stamps in between.

Additional detail regarding the metric compression system will now be provided with reference to the figures. For example, FIG. 1 illustrates a schematic diagram of an exemplary system environment ("environment") 100 in which a metric compression system 106 can be implemented. As illustrated in FIG. 1, the environment 100 includes a server(s) 102, a network 108, client devices 110a-110n, a metric storage server 112, and a web server 114.

Although the environment 100 of FIG. 1 is depicted as having a particular number of components, the environment 100 can have any number of additional or alternative components (e.g., a different number of servers, client devices, metric storage servers, web servers, or other components in communication with the metric compression system 106 via the network 108). Similarly, although FIG. 1 illustrates a particular arrangement of the server(s) 102, the network 108, the client devices 110a-110n, the metric storage server 112, and the web server 114, various additional arrangements are possible.

The server(s) 102, the network 108, the client devices 110a-110n, the metric storage server 112, and the web server 114 may be communicatively coupled with each other either directly or indirectly (e.g., through the network 108 as discussed in greater detail below in relation to FIG. 10). Moreover, the server(s) 102, the network 108, the client devices 110a-110n, the metric storage server 112, and the web server 114 may include a variety of computing devices (including one or more computing devices as discussed in greater detail below with relation to FIG. 10).

As mentioned above, the environment 100 includes the server(s) 102. In one or more embodiments, the server(s) 102 generates, stores, receives, and/or transmits digital data including digital metrics or compressed metric data. To provide an illustration, in some instances, the server(s) 102 collects digital metrics from one or more computing devices (e.g., one or more of the client devices 110a-110n). The server(s) 102 can transmit compressed metric data that corresponds to the collected digital metrics to another computing device, such as the metric storage server 112 for storage. In some instances, the server(s) 102 transmit the compressed metric data to the web server 114 for display of the collected digital metrics. In one or more embodiments, the server(s) 102 comprises a data server. In some embodiments, the server(s) 102 comprises a communication server or a web-hosting server (e.g., in addition to the web server 114).

As shown in FIG. 1, the server(s) 102 includes an analytics system 104. In one or more embodiments, the analytics system 104 collects, manages, and utilizes analytics data, such as digital metrics or data resulting from the analysis of sets of digital metrics. For example, in some implementations, the analytics system 104 collects digital metrics related to operation of a computer-implemented system (e.g., a computer-implemented transportation matching system) or the provision and/or performance of a product or service. The analytics system 104 collects the digital metrics in one or more ways. For example, in one or more embodiments, the analytics system 104 causes the server(s) 102 and/or a third-party network server (e.g., a server hosting a website or online service) to track digital metrics and report the tracked digital metrics for storage and/or analysis. In one or more embodiments, the analytics system 104 receives digital metrics directly from the client devices 110a-110n via data stored thereon or generated thereon.

Additionally, the server(s) 102 includes the metric compression system 106. In particular, in one or more embodiments, the metric compression system 106 utilizes the server(s) 102 to compress digital metrics for storage and/or transmission to another computing device (e.g., one of the client devices 110a-110n, the metric storage server 112, or the web server 114) via the network 108. In particular, the metric compression system 106 can utilize the server(s) 102 to generate compressed metric data from a set of digital metrics and transmit the compressed metric data to another computing device.

To illustrate, in one or more embodiments, the metric compression system 106, via the server(s) 102, generates a set of compressed metric data from a set of digital metrics that includes a plurality of metric values and a plurality of metric labels. In particular, via the server(s) 102, the metric compression system 106 generates, utilizing a graph-based compression dictionary shared between the server(s) 102 and another computing device, compressed metric label identifiers based on the plurality of metric labels. Further, via the server(s) 102, the metric compression system 106 sorts the set of digital metrics in a sequence based on the plurality of metric values and generates delta compression values according to the sequence using the sorted plurality of metric values. Accordingly, via the server(s) 102, the metric compression system 106 transmits the set of compressed metric data—including the compressed metric label identifiers and the delta compression values—to the other computing device across the network 108. In some implementations, the recipient computing device includes tools and features for decompressing the compressed metric data and determining the raw digital metrics.

In one or more embodiments, the metric storage server 112 stores digital metrics or the corresponding compressed metric data. For instance, in some cases, the metric storage server 112 includes a time-series database that stores digital metrics or the corresponding compressed metric data in accordance with associated time stamps. Further, in some implementations, the metric storage server 112 responds to queries for digital metrics. For instance, the metric storage server 112 can receive a query, retrieve the relevant digital metrics (or corresponding compressed metric data), and provide the digital metrics in response to the query. In some cases—such as when storing the digital metrics in an uncompressed format—the metric storage server 112 generates compressed metric data from the digital metrics and provides the compressed metric data in response to the query.

In some cases, the web server 114 displays or provides, for display, digital metrics or digital reports generated from an analysis of the digital metrics. For instance, the web server 114 can include various features for organizing and presenting digital metrics or related information (e.g., dashboards, graphs, tables, or charts generated using the digital metrics). In some cases, the web server 114 can submit a query for digital metrics, such as a query received from another computing device. The web server 114 can further provide the digital metrics received in response for display on the computing device. To illustrate, in some cases, the web server 114 submits a query to the metric storage server 112—either directly or through the server(s) 102—and provides the digital metrics or information related to the digital metrics received in response for display on another computing device. As suggested above, the web server 114 can receive compressed metric data in response to the query.

In one or more embodiments, the client devices 110a-110n include computing devices that can collect, generate, and/or transmit digital metrics or the corresponding compressed metric data. For example, the client devices 110a-110n can include smartphones, tablets, desktop computers, laptop computers, head-mounted-display devices, and/or other electronic devices. In some instances, the client devices 110a-110n include one or more applications (e.g., the client application 116) that can collect, generate, and/or transmit digital metrics or the corresponding compressed metric data. For example, in some embodiments, the client application 116 includes a software application installed on the client devices 110a-110n. In other cases, however, the client application 116 includes a web browser or other application that accesses a software application hosted on the server(s) 102.

As shown in FIG. 1, the client devices 110a-110n can implement the metric compression system 106. For instance, in some cases, the metric compression system 106 utilizes the client devices 110a-110n to collect or generate digital metrics (e.g., via the client application 116). The metric compression system 106 can further generate compressed metric data from the digital metrics for storage and/or transmission across the network 108.

Indeed, as shown by FIG. 1, the metric compression system 106 can be implemented in whole, or in part, by the individual elements of the environment 100. Although FIG. 1 illustrates the metric compression system 106 implemented with regard to the server(s) 102 and the client devices 110a-110n, different components of the metric compression system 106 can be implemented by a variety of devices within the environment 100. For example, one or more (or all) components of the metric compression system 106 can be implemented by a different computing device or some other server that is separate from the server(s) 102 hosting the analytics system 104 (e.g., the metric storage server 112 and/or the web server 114). Indeed, in some implementations, each computing device that is part of a network of computing devices can implement one or more (or all) components of the metric compression system 106. Thus, each computing device in the network can compress digital metrics for storage and/or transmission across the network to another computing device in the network. Example components of the metric compression system 106 will be described below with regard to FIG. 8.

Figure 2A:
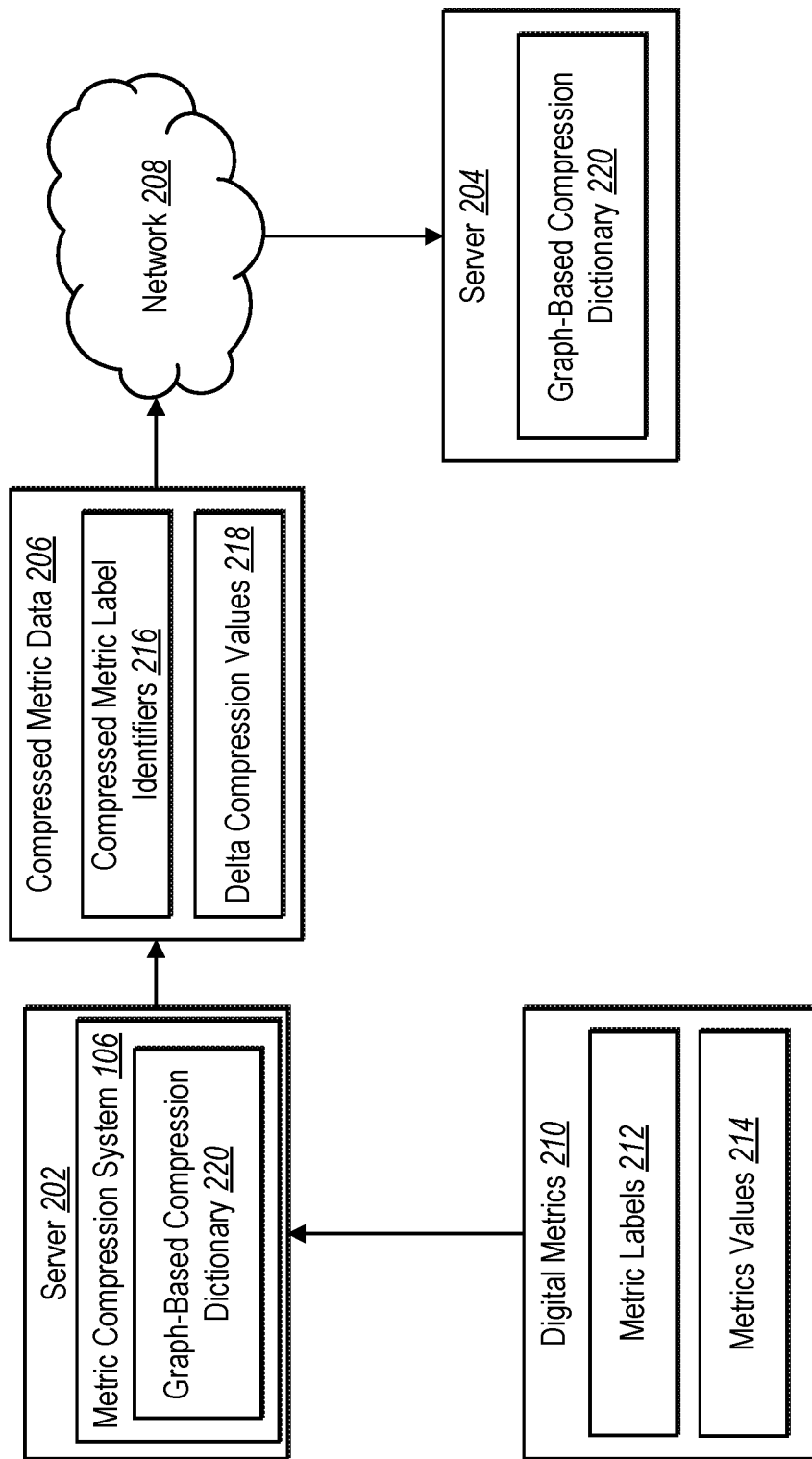
FIGS. 2A-2B illustrate overview diagrams of the metric compression system transmitting compressed metric data to a computing device across a network in accordance with one or more embodiments.
Figure 2B:
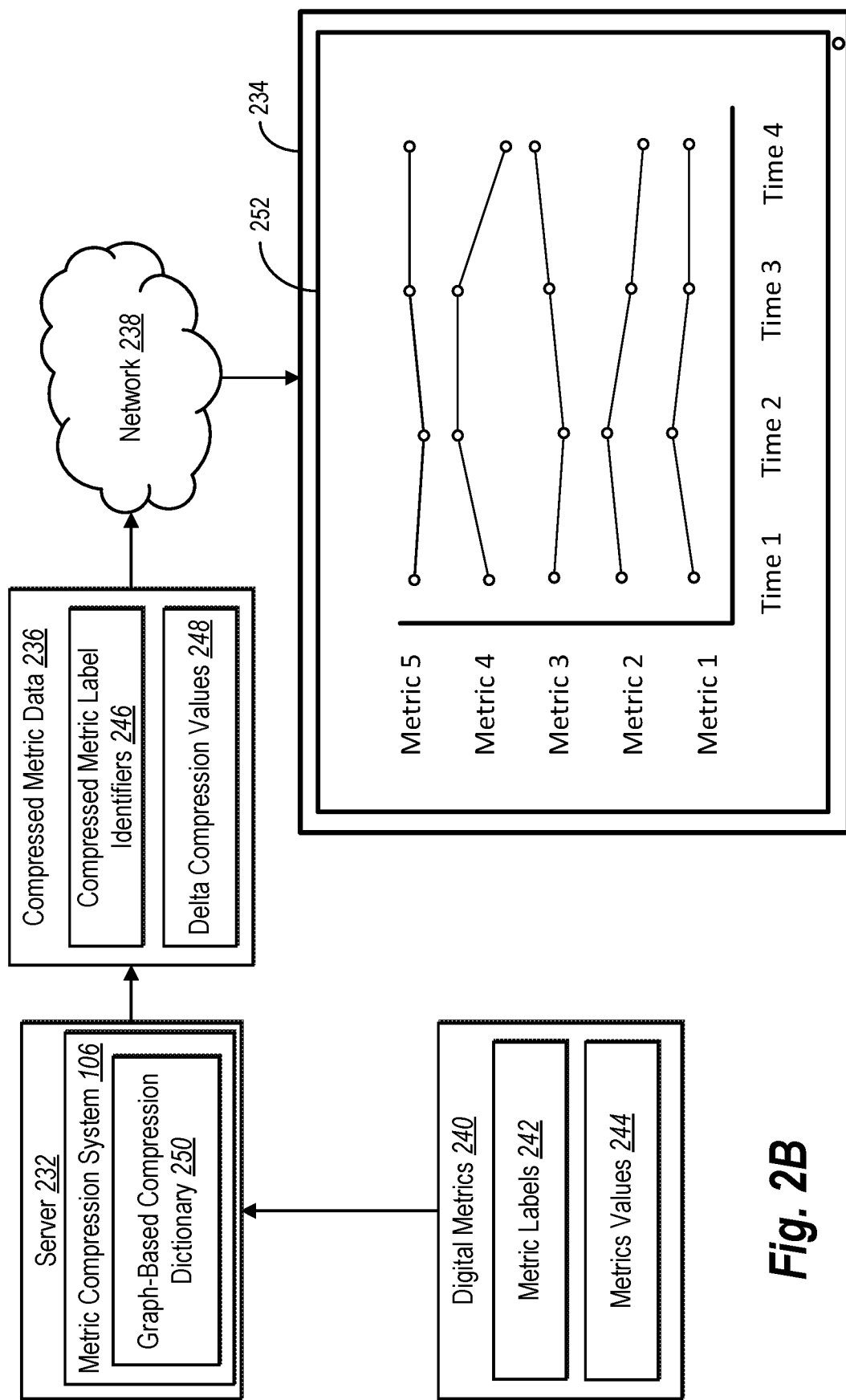

As mentioned above, the metric compression system 106 can compress a set of digital metrics by generating compressed metric data from the digital metrics. The metric compression system 106 can further store the compressed metric data or transmit the compressed metric data to another computing device across a network. FIGS. 2A-2B illustrate overview diagrams of the metric compression system 106 transmitting compressed metric data to a computing device across a network in accordance with one or more embodiments. It should be noted that FIGS. 2A-2B illustrate implementation of the metric compression system 106 on particular computing devices (i.e., servers) and transmission of the compressed metric data to other particular computing devices, but the generation and transmission of compressed metric data can involve various other computing devices not shown. Indeed, as indicated above, the metric compression system 106 can operate on various computing devices and transmit compressed metric data to various computing devices across a network. For instance, in some cases, the metric compression system 106 generates compressed metric data on a client device (e.g., a mobile device) and transmits the compressed metric data from the client device to a server.

FIG. 2A illustrates the metric compression system 106 transmitting compressed metric data 206 to a server 204 (i.e., server-to-server compression and transmission) in accordance with one or more embodiments. In particular, FIG. 2A illustrates the metric compression system 106 operating on a server 202 and generating the compressed metric data 206 at the server 202. The metric compression system 106 transmits the compressed metric data 206 from the server 202 to the server 204 across a network 208.

As shown in FIG. 2A, the metric compression system 106 generates the compressed metric data 206 from digital metrics 210. In some cases, the metric compression system 106 retrieves the digital metrics 210 from local storage. In some implementations, the metric compression system 106 retrieves the digital metrics 210 from remote storage. In some embodiments, the metric compression system 106 receives the digital metrics 210 from one or more computing devices (e.g., one or more components of a transportation matching system) or generates the digital metrics 210 at the server 202.

As illustrated in FIG. 2A, the digital metrics 210 includes metric labels 212 and metric values 214. For instance, in some instances, each digital metric represented in the digital metrics 210 includes a metric label and a metric value. In some cases, each digital metric includes a metric label and a plurality of metric values. For example, each digital metric can include metric values for a plurality of time stamps, indicating how the value of the digital metric has changed (or stayed the same) across time. Indeed, in some instances, the digital metrics 210 further include timestamps for the metric values 214.

As further shown in FIG. 2A, the compressed metric data 206 includes compressed metric label identifiers 216 and delta compression values 218. In one or more embodiments, each compressed metric label identifier from the compressed metric label identifiers 216 corresponds to a metric label from the metric labels 212. Similarly, in some embodiments, each delta compression value from the delta compression values 218 corresponds to a metric value from the metric values 214. In some implementations, the compressed metric data 206 further includes compressed time stamps that correspond to time stamps represented in the digital metrics 210. Thus, the metric compression system 106 can determine a compressed format for each segment of data represented in the digital metrics 210.

Additionally, as shown in FIG. 2A, the metric compression system 106 utilizes a graph-based compression dictionary 220 for generating the compressed metric data 206. In particular, the metric compression system 106 can utilize the graph-based compression dictionary 220 to generate the compressed metric label identifiers 216 from the metric labels 212. More detail regarding the graph-based compression dictionary 220 will be discussed below with reference to FIGS. 3A-3C.

As further illustrated in FIG. 2A, the metric compression system 106 shares the graph-based compression dictionary 220 with the server 204. Accordingly, the metric compression system 106 facilitates decompression of the compressed metric data 206 (i.e., the compressed metric label identifiers 216) at the server 204. For instance, in some cases, the metric compression system 106 also operates on the server 204 and decompresses the compressed metric data 206 utilizing the graph-based compression dictionary 220. In particular, the metric compression system 106 utilizes the graph-based compression dictionary 220 to determine the metric labels 212 from the compressed metric label identifiers 216. Thus, in some implementations, the metric compression system 106 utilizes the graph-based compression dictionary 220 to map metric labels to compressed metric label identifiers and vice versa.

In some cases, the metric compression system 106 transmits the compressed metric data 206 to the server 204 across the network 208 for storage of the compressed metric data 206 (or the digital metrics 210 in an uncompressed format), for analysis of the digital metrics 210, or for the performance of some other function. By transmitting the compressed metric data 206 rather than the digital metrics 210 themselves, the metric compression system 106 reduces the bandwidth consumed across the network 208.

FIG. 2B illustrates the metric compression system 106 transmitting compressed metric data 236 (including compressed metric label identifiers 246 and delta compression values 248) to a client device 234 in accordance with one or more embodiments (i.e., server-to-client compression and transmission). In particular, FIG. 2B illustrates the metric compression system 106 operating on a server 232 and generating the compressed metric data 236 at the server 232.

As shown, the metric compression system 106 generates the compressed metric data 236 from digital metrics 240 (including metric labels 242 and metric values 244) utilizing a graph-based compression dictionary 250.

In some implementations, the client device 234 requests multiple digital metrics across time. For example, to display a dashboard regarding performance of a computing system, the client device 234 may request multiple performance metrics for the past two hours. The metric compression system 106 can compress the digital metric values in multiple ways. For example, the metric compression system 106 can compress the digital metric values horizontally across time (e.g., compress metric values for the same metric horizontally within the time space). The metric compression system 106 can also compress the digital metric values vertically across digital metrics (e.g., across the metric name space). Specifically, the metric compression system 106 can determine delta values in both directions (either compressing horizontally first then vertically or vice versa). By compressing vertically and horizontally, the metric compression system 106 can significantly reduce the size of time series data transmitted across the computer network to the client device 234.

Additionally, as illustrated in FIG. 2B, the metric compression system 106 transmits the compressed metric data 236 to the client device 234 across the network 238. In particular, the metric compression system 106 provides the compressed metric data 236 for display of the digital metrics 240 on a graphical user interface 252 of the client device 234. For instance, in some cases, the metric compression system 106 also operates on the client device 234 and decompresses the compressed metric data 236 utilizing the graph-based compression dictionary 250 (and expanding compressed delta values). The metric compression system 106 further displays the digital metrics 240 in the uncompressed format on the graphical user interface 252 of the client device 234.

In some implementations, the metric compression system 106 transmits the compressed metric data 236 to another client device, such as a web server that is servicing a request from the client device 234. In particular, the metric compression system 106 can transmit the compressed metric data 236 to the other client device, which forwards the compressed metric data 236 or the digital metrics 240 in the uncompressed format to the client device 234.

Though not explicitly shown in FIGS. 2A-2B, in one or more embodiments, the metric compression system 106 generates compressed metric data at a client device and transmits the compressed metric data from the client device to another computing device, such as a server device. Indeed, in some implementations, the metric compression system 106 operates on a client device as mentioned above with reference to FIG. 1. To illustrate, in some embodiments, the metric compression system 106 operates on the client device to generate compressed metric data from digital metrics generated or otherwise collected at the client device. The metric compression system 106 can transmit, across a network, the compressed metric data to a server device that collects digital metrics from a plurality of client devices. Indeed, in some instances, the metric compression system 106 operates on a plurality of client devices, generates compressed metric data from digital metrics generated/collected at those client devices, and transmits the compressed metric data from each client device to a server device for centralized storage/management of the digital metrics.

Figure 3A:
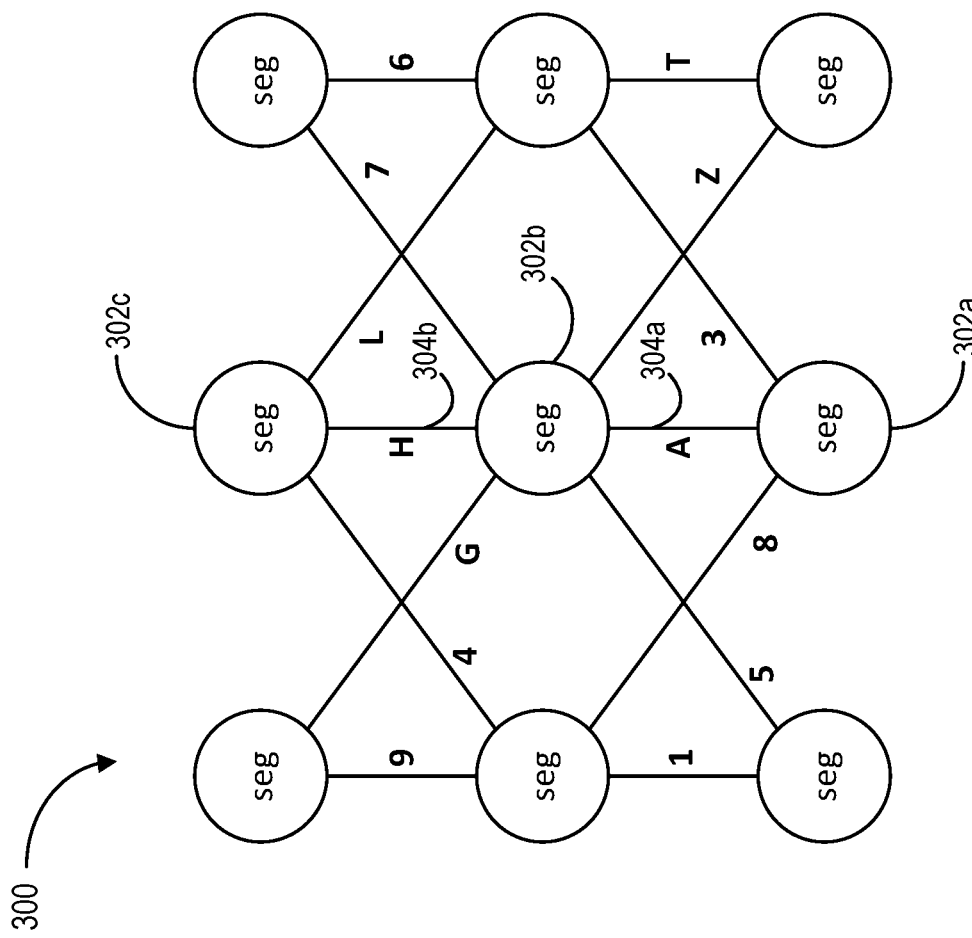
FIG. 3A illustrates a graph-based compression dictionary utilized by the metric compression system to generate compressed metric label identifiers in accordance with one or more embodiments.
Figure 3B:
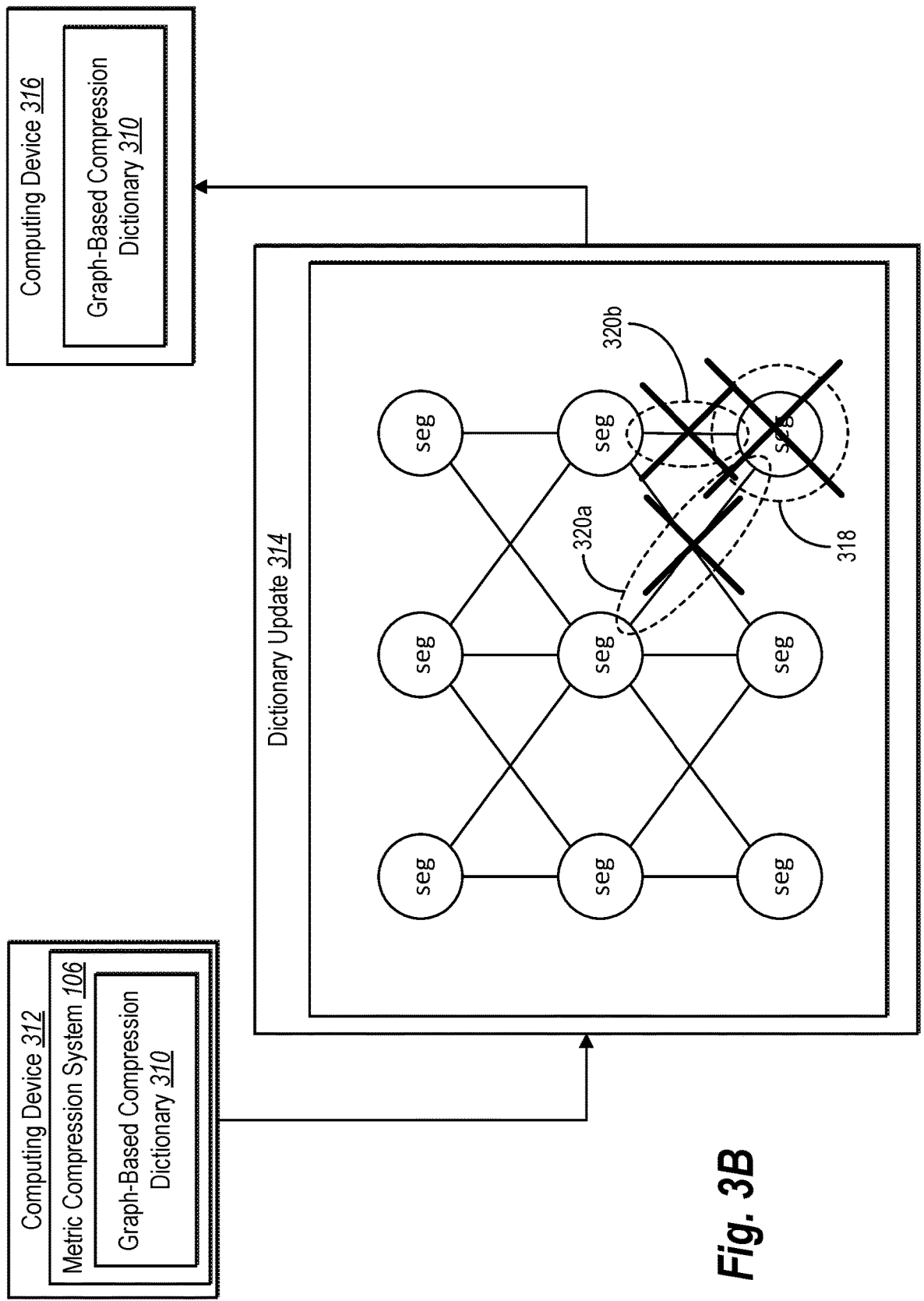
FIG. 3B illustrates a block diagram of utilizing a dictionary update for modifying a graph-based compression dictionary in accordance with one or more embodiments.
Figure 3C:
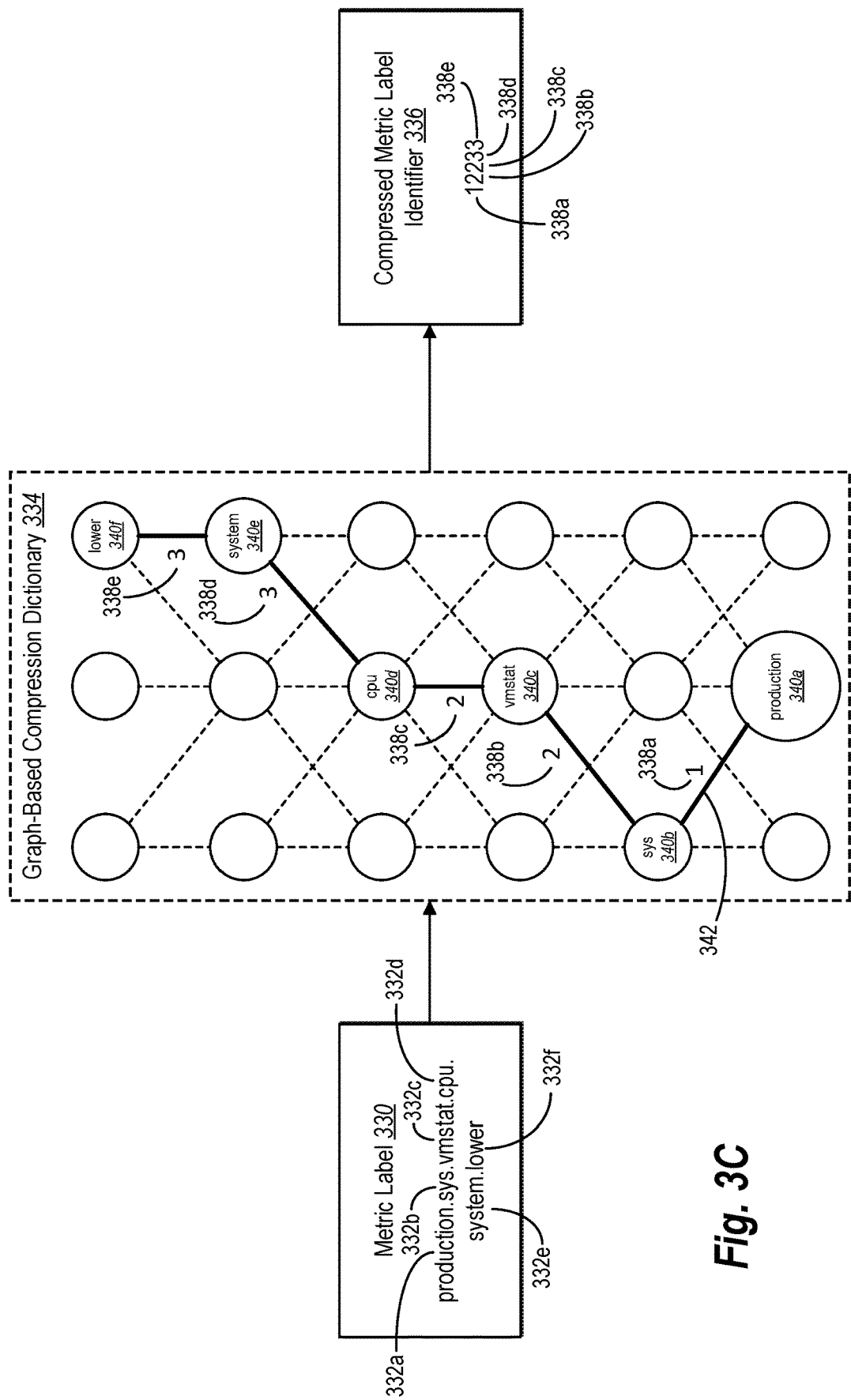
FIG. 3C illustrates a block diagram of utilizing a graph-based compression dictionary to generate a compressed metric label identifier from a metric label in accordance with one or more embodiments.

As discussed above, the metric compression system 106 can utilize a graph-based compression dictionary to compress the metric labels of digital metrics. In particular, the metric compression system 106 utilizes the graph-based compression dictionary to generate compressed metric label identifiers from metric labels. FIGS. 3A-3C illustrate utilizing a graph-based compression dictionary to generate compressed metric label identifiers in accordance with one or more embodiments.

In particular, FIG. 3A illustrates a graph-based compression dictionary 300 utilized by the metric compression system 106 to generate compressed metric label identifiers in accordance with one or more embodiments. As shown in FIG. 3A, the graph-based compression dictionary 300 includes a plurality of nodes (e.g., the nodes 302a-302c). Further, the graph-based compression dictionary 300 includes a plurality of edges (e.g., the edges 304a-304b).

As shown in FIG. 3A, the plurality of nodes correspond to various metric label segments (generically labeled "seg"). In some embodiments, each node corresponds to a metric label segment that is different than the metric label segments represented by the other nodes. For example, the node 302a can correspond to a metric label segment that differs from the metric label segments represented by the nodes 302b-302c or any other node of the graph-based compression dictionary 300. In other words, each node can represent a substring of letters, numbers, and/or other characters that differs from the substrings represented by the other nodes.

Thus, in some embodiments, a metric label is represented by multiple nodes within the graph-based compression dictionary 300. In particular, a metric label includes a string of letters, numbers, and/or other characters that includes multiple substrings corresponding to multiple nodes in the graph-based compression dictionary 300. In some implementations, multiple metric labels include one or more common substrings of letters, numbers, and/or other characters. Thus, in some instances, multiple metric labels are at least partially represented by one or more of the same nodes.

In some cases, however, a metric label corresponds to a single node from the graph-based compression dictionary 300. In other words, the metric label includes a single substring of letters, numbers, and/or other characters represented by a single node within the graph-based compression dictionary 300. For instance, as mentioned above, some metric labels can indicate a hierarchy where several digital metrics branch off from one digital metric. Thus, in some implementations, a metric label corresponds to a digital metric that is at the top of the hierarchy and includes a single substring represented by a single node.

In some embodiments, one or more nodes correspond to a particular position of a metric label segment within a metric label. For instance, the node 302a can correspond to a metric label segment at a first position within a metric label, the node 302b can correspond to a metric label segment at a second position within a metric label, and the node 302c can correspond to a metric label segment at a third position within a metric label. In some cases, the metric compression system 106 organizes the graph-based compression dictionary 300 into rows, columns, or to otherwise delineate sets of nodes so that each set of nodes correspond to a particular position of a metric label segment. To illustrate, the row of nodes that includes the node 302a can correspond to metric label segments for an initial position within a metric label, the row of nodes that includes the node 302b can correspond to metric label segments for a second position within a metric label, and the row of nodes that includes the node 302c can correspond to metric label segments for a third position within a metric label.

Accordingly, in some cases, multiple nodes within the graph-based compression dictionary 300 can represent the same metric label segment but for different positions within a metric label. For example, the node 302a can correspond to a metric label segment at an initial position within a metric label, and the node 302b can correspond to the same metric label segment but for a second position within a metric label.

As further illustrated by FIG. 3A, the plurality of edges correspond to metric label identifier values. In particular, in one or more embodiments, each edge corresponds to a single metric label identifier value. In some instances, each edge corresponds to a metric label identifier value that differs from the metric label identifier values corresponding to the other edges. In some cases, an edge represents a metric label identifier value that also corresponds to one or more other nodes; however, each edge can be distinct in the position of the metric label identifier value within the resulting compressed metric label identifier.

In one or more embodiments, the metric compression system 106 generates the graph-based compression dictionary 300 for use in generating compressed metric label identifiers. Further, in some implementations, the metric compression system 106 shares the graph-based compression dictionary 300 with one or more other computing devices, such as one or more computing devices to which compressed metric data is to be transmitted. Thus, the metric compression system 106 can facilitate decompression of the compressed metric label identifiers at the other computing device(s). In some embodiments, however, the metric compression system 106 receives the graph-based compression dictionary 300 from another computing device, such as a computing device from which compressed metric data will be received.

By utilizing a graph-based compression dictionary to generate compressed metric label identifiers, the metric compression system 106 can operate more efficiently than conventional systems. Indeed, the graph-based compression dictionary is more compact (e.g., smaller in size) than the hash maps and lookup tables utilized as compression dictionaries by many conventional systems. For instance, the graph-based compression dictionary can leverage commonalities among metric labels (e.g., common metric label segments) to represent the metric labels within a more compact form. Accordingly, the metric compression system 106 utilizes less memory resources to store the graph-based compression dictionary. Further, the metric compression system 106 consumes less bandwidth when transmitting the graph-based compression dictionary to one or more other computing devices.

As previously mentioned, in one or more embodiments, the graph-based compression dictionary includes a finite-state transducer. Accordingly, in one or more embodiments, the metric compression system utilizes an input tape (e.g., an input string) that represents one or more metric labels to generate an output tape (e.g., an output string) that includes one or more corresponding compressed metric label identifiers via the graph-based compression dictionary. To illustrate, in some embodiments, the graph-based compression dictionary includes a finite set of states (e.g., represented by the nodes). The graph-based compression dictionary can recognize (e.g., analyze) an input alphabet (e.g., composed of metric label segments) and produce an output using an output alphabet (e.g., composed of metric label identifier values). In one or more embodiments, the graph-based compression dictionary utilizes a metric label to transition between states (e.g., based on the metric label segments corresponding to the nodes) and generate a portion of the output (e.g., identify a metric label identifier value) that corresponds to that state transition. Upon completing state transitions for a metric label (e.g., upon reaching the state corresponding to the final metric label segment of the metric label), the graph-based compression dictionary can produce a compressed metric label identifier for the output tape.

FIG. 3B illustrates a block diagram of utilizing a dictionary update for modifying a graph-based compression dictionary 310 in accordance with one or more embodiments. Indeed, as previously discussed, the metric compression system 106 can share the graph-based compression dictionary 310 with one or more computing devices (or receive the graph-based compression dictionary from another computing device). Thus, the metric compression system 106 can utilize dictionary updates to dynamically modify the graph-based compression dictionary 310 and ensure synchronization with the other computing device(s).

In some embodiments, the metric compression system 106 determines to update the graph-based compression dictionary 310 to include metric label segments that were previously unrepresented, such as metric label segments for metric labels of digital metrics that were previously not tracked or otherwise not communicated among computing devices. In some implementations, the metric compression system 106 determines to update the graph-based compression dictionary 310 to exclude metric label segments that were previously included but are no longer needed, such as metric label segments for metric labels of digital metrics that will no longer be tracked or communicated among the computing devices. Accordingly, the metric compression system 106 can generate and transmit dictionary updates to instruct other computing devices on such modifications.

For example, as shown in FIG. 3B, the metric compression system 106 operates on a computing device 312. The metric compression system 106 stores the graph-based compression dictionary 310 on the computing device 312. In some cases, however, the metric compression system 106 stores the graph-based compression dictionary 310 at a remote location that is accessible to the computing device 312.

As further shown in FIG. 3B, the metric compression system 106 generates a dictionary update 314 and transmits the dictionary update 314 from the computing device 312 to another computing device 316. As illustrated, the dictionary update 314 indicates modifications to be made to the graph-based compression dictionary 310. In particular, the dictionary update 314 indicates that the node 318 and the edges 320a-320b are to be removed from the graph-based compression dictionary 310.

Indeed, in some embodiments, the metric compression system 106 determines that a digital metric having a metric label that includes the metric label segment represented by the node 318 is no longer to be tracked or communicated among computing devices. In some cases, the metric compression system 106 further determines that the metric label segment represented by the node 318 is not used in the metric label of other digital metrics currently tracked or communicated among the computing devices. Accordingly, the metric compression system 106 can generate and transmit the dictionary update 314 to indicate that the node 318 and the edges 320a-320b connected to the node 318 are to be deleted from the graph-based compression dictionary 310.

In some implementations, the dictionary update 314 additionally (or alternatively) indicates one or more nodes and edges to add to the graph-based compression dictionary 310. For example, the metric compression system 106 can determine (e.g., identify) one or more metric label segments that are currently unrepresented within the graph-based compression dictionary 310. Further, the metric compression system 106 can determine that the metric label segments are used in metric labels for digital metrics that will be tracked or communicated among the computing devices moving forward. Thus, the metric compression system 106 can generate and transmit the dictionary update 314 to indicate that the graph-based compression dictionary 310 is to be modified to represent the metric label segments. In particular, the metric compression system 106 can generate and transmit the dictionary update 314 to indicate nodes and edges to be added so that the graph-based compression dictionary 310 represents those metric label segments.

In some cases, the dictionary update 314 additionally (or alternatively) indicates one or more nodes and edges to modify. In particular, the dictionary update 314 can indicate that a node of the graph-based compression dictionary 310 that is currently associated with a particular metric label segment is to be modified so that the node is associated with a difference metric label segment. Similarly, the dictionary update 314 can indicate that an edge of the graph-based compression dictionary 310 that is currently associated with a particular metric label identifier value is to be modified so that the edge is associated with a different metric label identifier value.

In one or more embodiments, the metric compression system 106 updates the graph-based compression dictionary 310 stored on the computing device 312 device to remove, include, and/or modify those nodes and edges indicated by the dictionary update 314. In particular, the metric compression system 106 can determine modifications to be made to the graph-based compression dictionary 310, modify the graph-based compression dictionary 310 in accordance with the determined modifications, and generate the dictionary update 314 to instruct one or more other computing devices (e.g., the computing device 316) to make the same modifications. Thus, the metric compression system 106 ensures that the graph-based compression dictionary 310 is synchronized among the relevant computing devices.

In some implementations, the metric compression system 106 receives a dictionary update and modifies the graph-based compression dictionary 310 based on the received dictionary update. For example, the metric compression system 106 can operate on the computing device 312 and receive the dictionary update 314. The metric compression system 106 can determine the nodes and edges to add to or remove from the graph-based compression dictionary 310 based on the received dictionary update and can modify the graph-based compression dictionary 310 accordingly. For example, in some implementations, a dictionary update includes a list of metric label segments to add and/or remove from the graph-based compression dictionary 310. Accordingly, the metric compression system 106 can determine (e.g., identify) the nodes and edges that correspond to those metric label segments and add and/or remove those nodes and edges in accordance with the dictionary update.

By utilizing dictionary updates to modify a graph-based compression dictionary, the metric compression system 106 further improves upon efficiency when compared to conventional systems. For instance, by utilizing dictionary updates, the metric compression system 106 consumes fewer computing resources to update the graph-based compression dictionary when compared to other systems. Indeed, as previously explained, many conventional systems—such as those using hash maps and lookup tables as compression dictionaries—transmit the updated compression dictionary whenever changes are made. Thus, these conventional systems consume significant bandwidth in transmitting the updated compression dictionaries. By transmitting dictionary updates that merely indicate nodes and edges to add and/or remove, the metric compression system 106 avoids the need to transmit an updated graph-based compression dictionary. Thus, the metric compression system 106 reduces the bandwidth consumed in communicating updates to the compression dictionary.

Further, by utilizing dictionary updates, the metric compression system 106 operates more flexibly than conventional systems. Indeed, as the graph-based compression dictionary can be dynamically updated by adding or removing nodes and edges, the metric compression system 106 can flexibly modify the graph-based compression dictionary as needed. In particular, the graph-based compression dictionary can implement adjustments that incorporate the needed changes without replacing the entire graph-based compression dictionary as would typically be done under many conventional systems.

To provide an illustration of dictionary update use, the metric compression system 106 can provide a graph-based compression dictionary to a computing device that produces the digital metrics (e.g., collects/generates and reports on the digital metrics). Upon providing the graph-based compression dictionary, the metric compression system 106 enables that computing device to compress at least some of the digital metrics. Over time, however, the computing device can observe, collect, or generate additional digital metrics which cannot be compressed via the graph-based compression dictionary. Thus, the computing device transmits digital data consisting of both compressed and uncompressed data. By utilizing dictionary updates, the metric compression system 106 can adapt the graph-based compression dictionary to provide for improved compression that includes compression of those additional digital metrics.

FIG. 3C illustrates a block diagram of utilizing a graph-based compression dictionary to generate a compressed metric label identifier from a metric label in accordance with one or more embodiments. As shown, the metric compression system 106 identifies a metric label 330. For example, the metric compression system 106 can determine that the metric label 330 is part of a digital metric that is to be communicated to another computing device across a network. As further shown, the metric label 330 includes a plurality of metric label segments 332a-332f.

As further illustrated by FIG. 3C, the metric compression system 106 utilizes a graph-based compression dictionary 334 to generate a compressed metric label identifier 336 that corresponds to the metric label 330. In particular, the metric compression system 106 generates the compressed metric label identifier 336 to include a plurality of metric label identifier values 338a-338e that correspond to the metric label segments 332a-332f of metric label 330.

Indeed, as shown in FIG. 3C, the metric compression system 106 generates the compressed metric label identifier 336 by traversing the graph-based compression dictionary 334 based on the metric label segments 332a-332f of the metric label 330. For example, the metric compression system 106 identifies the node 340a of the graph-based compression dictionary 334 that corresponds to the metric label segment 332a of the metric label 330. The metric compression system 106 progresses from the node 340a to the node 340*b* that corresponds to the metric label segment 332*b*. In particular, the metric compression system 106 progresses between the nodes 340*a*-340*b* via the edge 342. The metric compression system 106 determines that the edge 342 corresponds to the metric label identifier value 338*a*. Thus, the metric compression system 106 can determine to use the metric label identifier value 338*a* as the first metric label identifier value for the compressed metric label identifier 336.

As shown in FIG. 3C, the metric compression system 106 similarly progresses to the nodes 340*c*-340*f* that correspond to the metric label segments 332*c*-332*f* in sequence. Based on the progression, the metric compression system 106 determines to utilize the metric label identifier values 338*b*-338*e* within the compressed metric label identifier 336. Thus, the metric compression system 106 generates the compressed metric label identifier 336 for the metric label 330. In one or more embodiments, the metric compression system 106 determines one or more additional instructions from the final node (e.g., the node 3400 of the sequence—such as an instruction to send, not send, archive, or buffer and delete the compressed metric label identifier 336. The metric compression system 106 can manage the compressed metric label identifier in accordance with these instructions. In some implementations, other nodes include similar information. For instance, the nodes can include one or more flags providing other instructions or status indicators for the corresponding metric label segments. For instance, in one or more embodiments, a node corresponding to a metric label segment can indicate that digital metrics associated with the metric label segment are not to be read (e.g., collected or transmitted). In response to such an indication, the metric compression system 106 can avoid further processing/compression of the digital metric and conserve the computing resources that would be otherwise consumed.

Because graph-based compression dictionaries are more compact than other compression dictionaries typically used by conventional systems, the metric compression system 106 can generate compressed metric label identifiers more efficiently than such systems. Indeed, the metric compression system 106 can quickly traverse the graph-based compression dictionary due to its small size. Thus, the metric compression system 106 requires comparatively fewer computing resources—such as processing time and power—in order to traverse the graph-based compression dictionary and generate a compressed metric label identifier.

Figure 4:
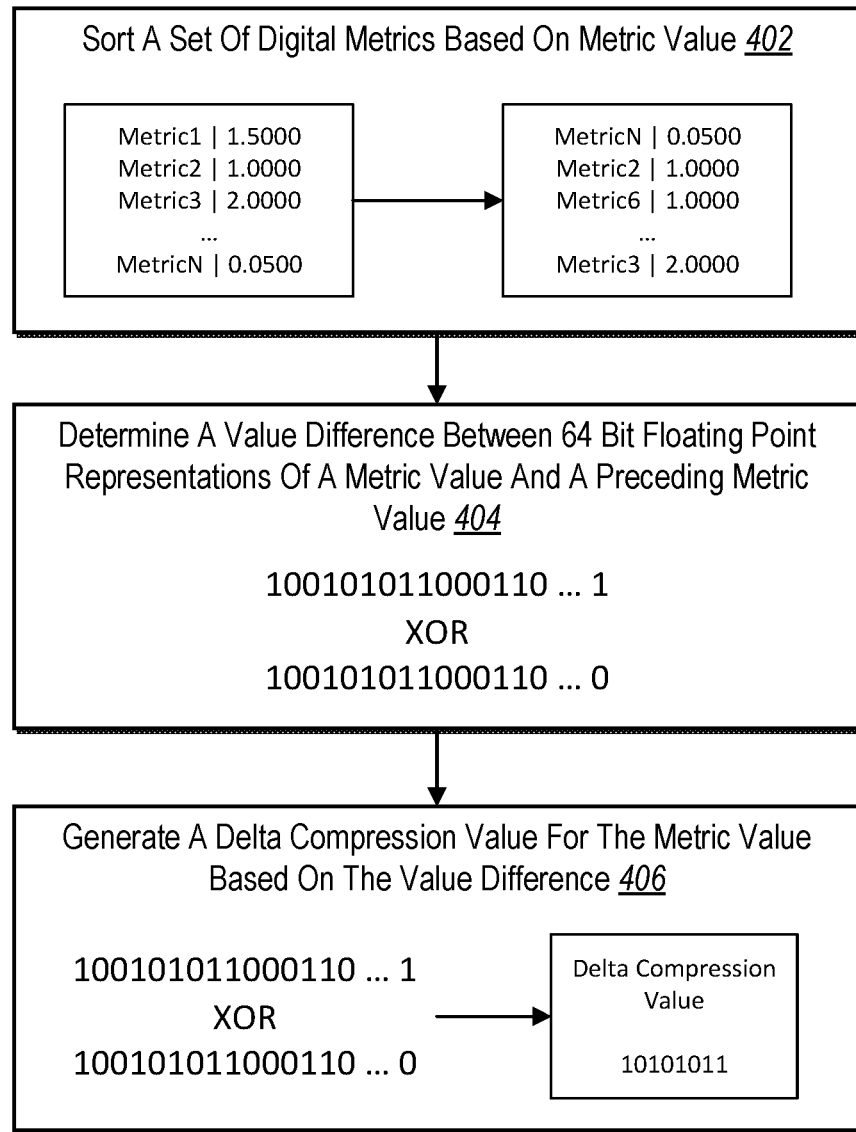
FIG. 4 illustrates a block diagram for generating a delta compression value for a metric value of a digital metric in accordance with one or more embodiments.

As discussed above, in some embodiments, the metric compression system 106 generates compressed metric data for digital metrics by further generating delta compression values for the metric values of the digital metrics. FIG. 4 illustrates a block diagram for generating a delta compression value for a corresponding metric value of a digital metric in accordance with one or more embodiments.

For example, as shown in FIG. 4, the metric compression system 106 performs an act 402 of sorting a set of digital metrics based on metric values. For example, the metric compression system 106 can sort the metric values of the digital metrics into an ordered list of increasing or decreasing value. Accordingly, the metric compression system 106 can sort the metric values so that metric values that are close or equal in value are close in proximity (e.g., adjacent to one another) within the sorted list.

As further shown in FIG. 4, the metric compression system 106 performs an act 404 of determining a value difference between 64-bit floating point representations of a metric value and a preceding metric value (e.g., another metric value that immediately precedes the metric value within the sorted list). Indeed, in one or more embodiments, the metric compression system 106 determines a 64-bit floating point representation of each metric value within the sorted list of metric values. In some embodiments, the metric compression system 106 utilizes other bit representations of the metric values, such as a 32-bit floating point representation.

In one or more embodiments, the metric compression system 106 determines the value difference between the 64-bit floating point representations of the metric value and the preceding metric value by performing a logical XOR using the pair of metric values, though other methods can be used as previously mentioned.

Additionally, as shown in FIG. 4, the metric compression system 106 preforms an act 406 of generating a delta compression value for the metric value based on the value difference. In particular, the metric compression system 106 generates a set of bits for the metric value—the set of bits being smaller than those used to represent the metric value in its uncompressed format—that represents the value difference between the metric value and the preceding metric value. In some implementations, the metric compression system 106 generates the set of bits by generating one or more subsets of bits based on the value difference.

To illustrate, upon determining that the metric value and the preceding metric value includes the same value (e.g., the result of the XOR operation is all zeros), the metric compression system 106 can generate a subset of bits that includes a single bit (e.g., a '0' bit) to indicate that there is no value difference. In one or more embodiments, the metric compression system 106 utilizes the single bit indicating the lack of value difference as the delta compression value for the metric value. Thus, the metric compression system 106 can compress the metric value into a one-bit representation when there is no value difference between the metric value and the preceding metric value within the sorted list.

In one or more embodiments, upon determining that there is a value difference between the metric value and the preceding metric value, the metric compression system 106 generates a first subset of bits that includes a single bit (e.g., a '1' bit) to indicate that a value difference exists. The metric compression system 106 can further generate one or more additional subsets of bits to provide further information regarding the value difference.

For instance, the metric compression system 106 can determine whether the resulting value from the XOR operation applied to the metric value and the preceding metric value fits within the same bounds as the resulting value from the preceding XOR operation—that is, the XOR operation applied to the preceding metric value and the metric value before the preceding metric value within the sorted list. In other words, the metric compression system 106 determines whether the resulting value from the XOR operation includes at least as many leading zeros and as many trailing zeros as the resulting value from the preceding XOR operation.

Upon determining that the resulting value from the XOR operation does fit within the same bounds, the metric compression system 106 can generate a subset of bits that includes a first bit (e.g., a '0' bit) to indicate the resulting value fits. The subset of bits can further include one or more additional bits that represent the resulting value from the XOR operation beginning at the location of the first significant bit (e.g., the first '1' bit) of the resulting value from the preceding XOR operation.

Upon determining that the resulting value from the XOR operation does not fit within the same bounds, the metric compression system 106 can generate a subset of bits that includes a first bit (e.g., a '1' bit) to indicate that the resulting value does not fit. The subset of bits can further include several bits (e.g., the next five bits) that indicate the number of leading zeros in the resulting value of the XOR operation, several additional bits (e.g., the next six bits) that indicate the length of the meaningful portion of the resulting value (e.g., the length of the portion that follows the leading zeros), and several more additional bits that represent those meaningful bits (e.g., includes the meaningful bits themselves). In some implementations, the bits indicating the length of the meaningful portion of the resulting value indicate the length minus one to fit the representation within a set number of bits (e.g., six bits) regardless of the length.

Thus, the metric compression system 106 can generate a delta compression value for a metric value of a digital metric based on the difference (e.g., the delta) in value between the metric value and the preceding metric value within the sorted list. The metric compression system 106 can similarly generate delta compression values for the other metric values represented in the sorted list.

In one or more embodiments, the metric compression system 106 does not generate a delta compression value for the first metric value in the sorted list. Rather, the metric compression system 106 can utilize the uncompressed 64-bit floating point representation (or other bit representation) to represent the metric value within the compressed metric data. Further, in one or more embodiments, the metric compression system 106 treats the resulting value of the XOR operation for the second metric value in the sorted list as not fitting within the bounds of the resulting value of the preceding XOR operation as there is not a preceding XOR operation.

By sorting the digital metrics based on metric value and generating the delta compression values using the sorted metric values, the metric compression system 106 improves the compression of digital metrics. In particular, the metric compression system 106 can reduce the representation of the digital metrics into fewer bits when compared to the compression provided by many conventional systems. Indeed, as discussed above, in one or more embodiments, the digital metrics that are compressed are associated with the same time stamp—the metric values represent the values of those digital metrics at the same instant in time. As such, the metric compression system 106 can sort the metric values so that similar values are closer together and digital metrics having identical metric values are adjacent to one another in the sorted list. Thus, the metric compression system 106 can compress many of these metric values down to a single bit indicating that a metric value is the same as the preceding metric value. With compressed metric data of smaller size, the metric compression system 106 can utilize less bandwidth to transmit the compressed metric data across a network or less memory to store the compressed metric data. By compressing metric values associated with the same time stamp (or time period), the metric compression system 106 further provides improved flexibility when compared to conventional systems, which are typically limited to compressing the values of a digital metric across time and in time order.

In one or more embodiments, the metric compression system 106 further sorts the metric labels (or the corresponding compressed metric label identifiers) of the digital metrics based on their corresponding metric values (e.g., in an order different than a time order). In other words, when sorting the digital metrics based on their metric values, the metric compression system 106 can also sort the metric labels (or the corresponding compressed metric label identifiers) so that they are in the same order as the metric values within the sorted list. Accordingly, when transmitting the compressed metric data to a computing device across a network, the metric compression system 106 can transmit the compressed metric label identifiers in the same order as the delta compression values.

Figure 5:
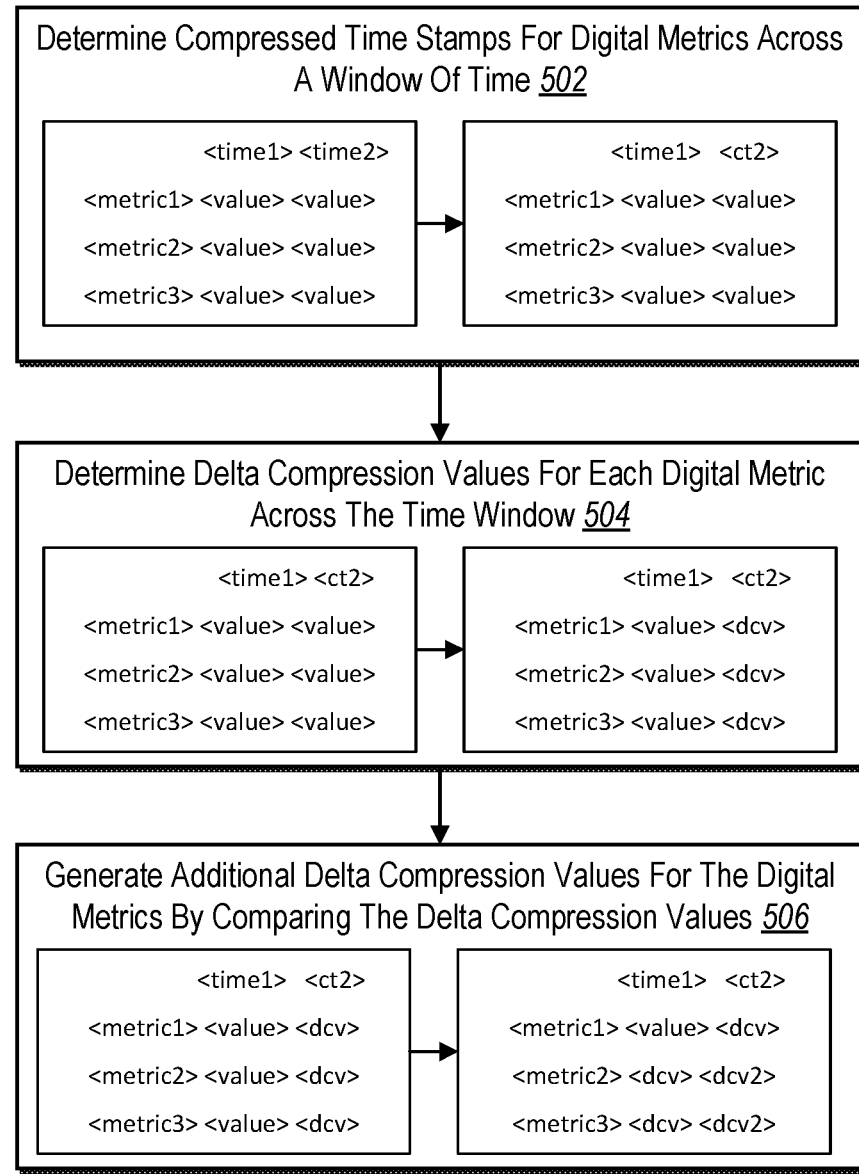
FIG. 5 illustrates a block diagram for generating delta compression values for digital metrics across a window of time in accordance with one or more embodiments.

As mentioned, in one or more embodiments, the metric compression system 106 generates compressed metric data from digital metrics for the same slice of time (e.g., the same time stamp or time period). In some embodiments, however, the metric compression system 106 further generates compressed metric data for digital metrics across a window of time (e.g., for multiple time stamps or a range of time periods). For instance, in some implementations, the metric compression system 106 receives, from a computing device, a request for digital metrics that requests the metric values for those digital metrics across a window of time. Accordingly, the metric compression system 106 can respond to the request by transmitting, to the computing device, compressed metric data that represents the digital metrics within the window of time. FIG. 5 illustrates a block diagram for generating delta compression values for digital metrics across a window of time in accordance with one or more embodiments.

As shown in FIG. 5, the metric compression system 106 performs an act 502 of determining compressed time stamps for digital metrics across a window of time. In particular, the metric compression system 106 determines compressed time stamps for the time stamps included in the window of time. In one or more embodiments, the metric compression system 106 determines the window of time from a request or other indication that defines the window of time.

In one or more embodiments, the metric compression system 106 determines the compressed time stamps by determining a delta of deltas for those time stamps. For example, the metric compression system 106 can determine a first time delta for a time stamp by determining the difference in time between that time stamp and the preceding time stamp. The metric compression system 106 can further determine a second time delta for the time stamp by determining the difference between the first time delta for that time stamp and the first time delta for the preceding time stamp. To illustrate, if metric values of the digital metrics are consistently captured every minute, the first time delta can equal sixty seconds and the second time delta can equal zero (as the first time delta of the previous time stamp would also equal sixty seconds).

In one or more embodiments, if the second time delta for a time stamp equals zero, the metric compression system 106 generates the corresponding compressed time stamp using a single bit (e.g., a '0' bit) indicating that the second time delta is zero. In some cases, if the value of the second time delta is within a first range of values, the metric compression system 106 generates the corresponding compressed time stamp using a pair of bits (e.g., a '10' pair of bits) followed by a set of bits representing the second time delta. If the value of the second time delta is within a second range of values, the metric compression system 106 can generate the corresponding compressed time stamp using a trio of bits (e.g., a '110' trio of bits) followed by a set of bits representing the second time delta. If the value of the second time delta is within a third range of values, the metric compression system 106 can generate the corresponding compressed time stamp using a quadruple of bits (e.g., a '1110' quadruple of bits) followed by a set of bits representing the second time delta. In some embodiments, if the value of the second time delta falls outside of all of the time ranges, the metric compression system 106 generates the corresponding compressed time stamp using a designated set of bits (e.g., a '1111' quadruple of bits) followed by a set of bits representing the second time delta. In one or more embodiments, the second range of values includes the first range of values and the third range of values includes the second range of values. In other words, the metric compression system 106 determines the value ranges to progressively accommodate larger second delta values.

In one or more embodiments, the metric compression system 106 does not generate a compressed time stamp for the first time stamp in the time window. Rather, the metric compression system 106 represents the first time stamp in an uncompressed format within the compressed metric data.

Additionally, as shown in FIG. 5, the metric compression system 106 performs an act 504 for determining delta compression values for each digital metric across the time window. For example, in one or more embodiments, the metric compression system 106 determines the delta compression values for each digital metric in a similar manner as discussed above with reference to FIG. 4. For instance, for a metric value associated with a digital metric at a particular time stamp, the metric compression system 106 can determine a value difference between the first metric value and a preceding metric value associated with the same digital metric at the preceding time stamp. The metric compression system 106 can generate the delta compression value for the metric value by generating a set of bits based on the value difference (e.g., whether a value difference exists and, if so, what that value difference is).

Thus, the metric compression system 106 can generate delta compression values for the digital metrics across the time window. In one or more embodiments, the metric compression system 106 does not initially generate delta compression values for the metric values of the digital metrics for the first time stamp (e.g., there are no metric values of a preceding time stamp for comparison).

As further shown in FIG. 5, the metric compression system 106 performs an act 506 of generating additional delta compression values for the digital metrics by comparing the delta compression values. In particular, the metric compression system 106 can generate the additional delta compression values as discussed above with reference to FIG. 4. That is, the metric compression system 106 can compare the delta compression values previously determined for the metric values associated with the same time stamp and generate additional delta compression values for the metric values based on the value difference. In one or more embodiments, where delta compression values were not previously determined for metric values (e.g., for the metric values associated with the first time stamp), the metric compression system 106 can also determine delta compression values for those metric values. In one or more embodiments, the metric compression system 106 does not sort the metric values when generating compressed metric data for a window of time to keep the final delta compression values with the appropriate compressed metric label identifier at each time stamp.

Thus, in some embodiments, the resulting compressed metric data represents some metric values that have been compressed once and some metric values that have been compressed twice—that is, via a first compression across various time stamps and a second compression within each time stamp. By generating delta compression values via the first and second compressions described above, the metric compression system 106 can operate more flexibly than conventional systems. Indeed, as previously mentioned, many conventional systems are limited to compressing data for digital metrics across time. Thus, the metric compression system 106 provides additional compression within each time stamp. Such additional compression further offers improved efficiency. For instance, by only performing compression across time, conventional systems typically fail to compress the metric values associated with the initial time stamp of the time window. By incorporating compression within each time stamp, the metric compression system 106 can compress these values. Further, by compressing some metric values twice, the metric compression system 106 can further reduce the compressed representations of those metric values, allowing for lesser demands on memory for storage or bandwidth for transmitting the compressed metric data across a network.

Though FIG. 5 illustrates an embodiment where the metric compression system 106 determines delta compression values by comparing metric values across a time window and then determining additional delta compression values by comparing metric values (or previously determined delta compression values) within the same time stamp, it should be noted that the metric compression system 106 can compare metric values within a time stamp first and then compare metric values (or previously determined delta compression values) across the time window in some implementations.

In one or more embodiments, the metric compression system 106 generates the delta compression values for the digital metrics across the window of time via gorilla-based compression. Further, the metric compression system 106 can generate the compressed time stamps via gorilla-based compression. Indeed, as mentioned above, the digital metrics compressed by the metric compression system 106 can include time series data. The metric compression system 106 can utilize XOR comparison with previous values to generate a delta encoding for each digital metric. To illustrate, the metric compression system 106 can compress a data stream that includes the digital metrics into blocks partitioned by time. The metric compression system 106 can store the first metric value and corresponding time stamp in a less compressed format along with header data. Further, the metric compression system 106 can compress the remaining time stamps using delta-of-delta compression and compress the metric values using XOR compression (e.g., such as described above). In one or more embodiments, the metric compression system 106 generates the delta compression values and/or the compressed time stamps as described in Tuomas Pelkonen et al., *Gorilla: A Fast, Scalable, In-Memory Time Series Database*, in Proceedings of the VLDB Endowment, Vol. 8, No. 12, 2015, which is incorporated herein by reference in its entirety.

Figure 6:
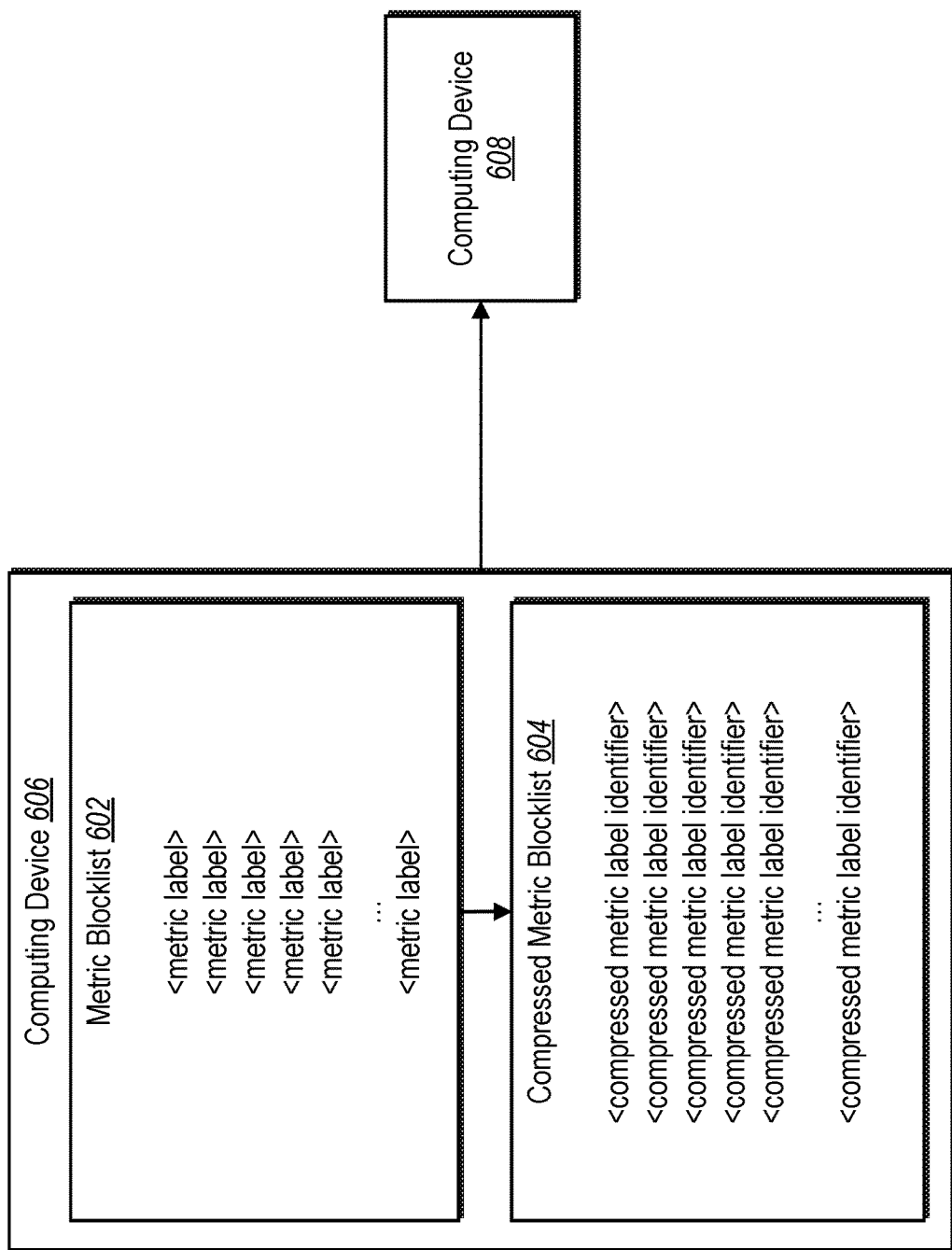
FIG. 6 illustrates a block diagram for compressing a metric blocklist in accordance with one or more embodiments.

As mentioned above, in one or more embodiments, the metric compression system 106 utilizes a metric blocklist to indicate digital metrics that are not to be tracked (e.g., to be withheld from storage or transmission across a network). Further, the metric compression system 106 can compress the metric blocklist. FIG. 6 illustrates a block diagram for compressing a metric blocklist in accordance with one or more embodiments.

As shown in FIG. 6, the metric compression system 106 identifies a metric blocklist 602 for compression. For instance, as shown, the metric compression system 106 identifies the metric blocklist 602 at the computing device 606 (e.g., the computing device at which the metric compression system operates). In one or more embodiments, the metric compression system 106 generates the metric blocklist 602 (e.g., at the computing device 606). For example, the metric compression system 106 can identify one or more digital metrics that are to be withheld from storage or transmission across a network. In some embodiments, the metric compression system 106 identifies the digital metrics by receiving user input that specifies the digital metrics or one or more metric categories associated with the digital metrics. In some implementations, the metric compression system 106 monitors use of the digital metrics, such as their use in communication, analysis, etc. Upon determining that the digital metrics are not used or not used with a frequency that satisfies a threshold, the metric compression system 106 can determine to add the digital metrics to the metric blocklist 602.

In one or more embodiments, the metric compression system 106 generates the metric blocklist 602 by adding some indicator that references the digital metrics that are to be withheld from storage or transmission across a network. For instance, as shown in FIG. 6, the metric compression system 106 can generate the metric blocklist 602 to include a plurality of metric labels of the digital metrics that are to be withheld from storage or transmission across a network. In one or more embodiments, the metric compression system 106 generates the metric blocklist 602 as described in U.S. patent application Ser. No. 17/410,873 filed on Aug. 24, 2021, entitled INTELLIGENTLY GENERATING AND DEPLOYING A METRIC BLOCKLIST WITHIN A DISTRIBUTED COMPUTING SYSTEM TO EFFICIENTLY MANAGE DATA METRIC REQUESTS, the contents of which are expressly incorporated herein by reference in their entirety.

As shown in FIG. 6, the metric compression system 106 compresses the metric blocklist 602 by generating a compressed metric blocklist 604. As illustrated, the metric compression system 106 can generate the compressed metric blocklist 604 by generating a list of compressed metric label identifiers that correspond to the metric labels represented in the metric blocklist 602. In one or more embodiments, the metric compression system 106 generates the compressed metric label identifiers utilizing a graph-based compression dictionary as discussed above with reference to FIGS. 3A-3C.

In one or more embodiments, the metric compression system 106 stores the compressed metric blocklist 604 (e.g., at the computing device 606). Accordingly, by generating the compressed metric blocklist 604, the metric compression system 106 reduces the storage consumed. Further, in some cases, the metric compression system 106 transmits the compressed metric blocklist 604 to one or more computing devices, such as the computing device 608 (e.g., across a network). Thus, by generating the compressed metric blocklist 604, the metric compression system 106 reduces the bandwidth consumed in transmission. For example, the metric compression system 106 can transmit the compressed metric blocklist 604 to a plurality of client devices such that the client devices intercept or block metric requests for digital metrics from a metric storage device.

As mentioned above, the metric compression system 106 can operate more efficiently than many conventional systems. In particular, the metric compression system 106 can provide improved compression that reduces the size of digital metrics more than the compression approaches employed by the conventional systems. Thus, the metric compression system 106 can store and/or transmit the compressed metric data with improved efficiency. Researchers have conducted studies to determine the effectiveness of one or more embodiments of the metric compression system 106 in compressing digital metrics. FIG. 7 illustrates a table reflecting experimental results regarding the effectiveness of the metric compression system 106 in accordance with one or more embodiments.

In particular, the table of FIG. 7 illustrates the effectiveness of the metric compression system 106 in compressing digital metrics, which allows for improved storage and transmission efficiency. As shown, the table of FIG. 7 compares the performance of one or more embodiments of the metric compression system 106 with the performance of various conventional compression techniques in compressing a dataset consisting of ten thousand digital metrics collected from various metric emitters. In particular, the table compares the metric compression system 106 with one system that performs GNU zip ("Gzip") compression, another system that performs Zstandard ("Zstd") compression, and another system that performs Snappy ("Snappy Encoded Protobuf") compression.

The table illustrates the performance of each tested system by providing the size of the resulting compressed metric data as well as the compression ratio that indicates the size reduction from the uncompressed dataset. The table also includes the size of the uncompressed data set for reference.

As shown in FIG. 7, each embodiment of the metric compression system 106 provides improved performance over the other tested methods. In particularly, the metric compression system 106 provides an improved compression ratio due to generating compressed metric data of a smaller size when compared to the other systems. Thus, the metric compression system 106 allows for reduced computing resources, such as memory and bandwidth, when storing or transmitting the compressed metric data when compared to the other systems.

Figure 8:
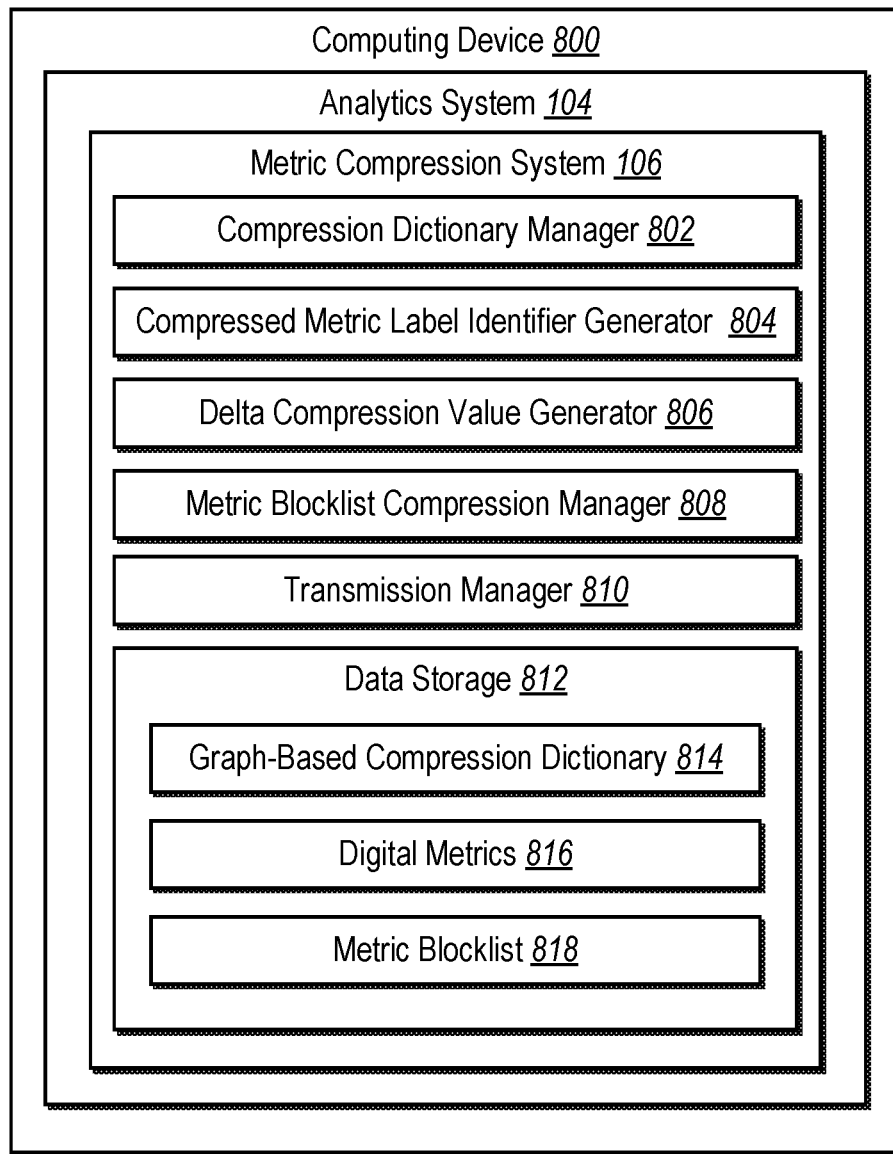
FIG. 8 illustrates an example schematic diagram of a metric compression system in accordance with one or more embodiments.

Turning now to FIG. 8, additional detail will now be provided regarding various components and capabilities of the metric compression system 106. In particular, FIG. 10 illustrates the metric compression system 106 implemented by the computing device 800 (e.g., the server(s) 102, one of the client devices 110a-110n, the metric storage server 112, and/or the web server 114 discussed above with reference to FIG. 1). Additionally, the metric compression system 106 is also part of the analytics system 104. As shown, in one or more embodiments, the metric compression system 106 includes, but is not limited to, the compression dictionary manager 802, the compressed metric label identifier generator 804, the delta compression value generator 806, the metric blocklist compression manager 808, a transmission manager 810, and data storage 812 (which includes a graph-based compression dictionary 814, digital metrics 816, and a metric blocklist 818).

As just mentioned, and as illustrated in FIG. 8, the metric compression system 106 includes the compression dictionary manager 802. In one or more embodiments, the compression dictionary manager 802 manages the graph-based compression dictionary utilized to generate compressed metric label identifiers. For example, the compression dictionary manager 802 can receive dictionary updates transmitted from another computing device and modify the graph-based compression dictionary in accordance with the dictionary update (e.g., by adding or removing nodes and edges). In some cases, the compression dictionary manager 802 determines digital metrics to include in or remove from the graph-based compression dictionary. The compression dictionary manager 802 can modify the graph-based compression dictionary accordingly and generate a dictionary update instructing other computing devices to similarly modify their copies of the graph-based compression dictionary.

Additionally, as shown in FIG. 8, the metric compression system 106 includes the compressed metric label identifier generator 804. In one or more embodiments, the compressed metric label identifier generator 804 generates compressed metric label identifiers corresponding to metric labels of digital metrics. For example, in some instances, the compressed metric label identifier generator 804 utilizes the graph-based compression dictionary managed by the compression dictionary manager 802 to generate compressed metric label identifiers from metric labels.

As illustrated in FIG. 8, the metric compression system 106 further includes the delta compression value generator 806. In one or more embodiments, the delta compression value generator 806 generates delta compression values that correspond to metric values of digital metrics. For instance, in some cases, the delta compression value generator 806 generates delta compression values for metric values associated with the same time stamp by comparing the metric values within the time stamp. In some cases, the delta compression value generator 806 generates the delta compression values for digital metrics across a time window. For instance, the delta compression value generator 806 can generate delta compression value for digital metrics by comparing the metric values of the digital metric across the time stamps included in the time window and further comparing the metric values of the digital metrics within the same time stamp.

Further, as shown in FIG. 8, the metric compression system 106 includes the metric blocklist compression manager 808. In one or more embodiments, the 808 generates a metric blocklist to indicate digital metrics that are to be withheld from storage or transmission across a network. The metric blocklist compression manager 808 can further compress the metric blocklist by generating a compressed metric blocklist. For instance, the metric blocklist compression manager 808 can generate compressed metric label identifiers for the metric labels included within the metric blocklist.

As shown in FIG. 8, the metric compression system 106 also includes the transmission manager 810. In one or more embodiments, the transmission manager 810 transmits digital data to one or more other computing devices across a network. In particular, the transmission manager 810 can transmit compressed data across a network. For example, the transmission manager 810 can transmit compressed metric data that includes compressed metric label identifiers and delta compression values. The transmission manager 810 can also transmit a compressed metric blocklist. In some implementations, the transmission manager 810 can transmit dictionary updates for a graph-based compression dictionary to one or more other computing devices.

Additionally, as shown in FIG. 8, the metric compression system 106 includes data storage 812. In particular, data storage 812, includes the graph-based compression dictionary 814, digital metrics 816, and the metric blocklist 818. In one or more embodiments, the graph-based compression dictionary 814 stores the graph-based compression dictionary managed by the compression dictionary manager 802 and utilized by the compressed metric label identifier generator 804 to generate compressed metric label identifiers. In some implementations, digital metrics 816 includes digital metrics that are tracked, including those to be transmitted to one or more other computing devices across a network (e.g., in a compressed format). In some embodiments, the metric blocklist 818 stores the metric blocklist generated by the metric blocklist compression manager 808.

Each of the components 802-818 of the metric compression system 106 can include software, hardware, or both. For example, the components 802-818 can include one or more instructions stored on a computer-readable storage medium and executable by processors of one or more computing devices, such as a client device or server device. When executed by the one or more processors, the computer-executable instructions of the metric compression system 106 can cause the computing device(s) to perform the methods described herein. Alternatively, the components 802-818 can include hardware, such as a special-purpose processing device to perform a certain function or group of functions. Alternatively, the components 802-818 of the metric compression system 106 can include a combination of computer-executable instructions and hardware.

Furthermore, the components 802-818 of the metric compression system 106 may, for example, be implemented as one or more operating systems, as one or more stand-alone applications, as one or more modules of an application, as one or more plug-ins, as one or more library functions or functions that may be called by other applications, and/or as a cloud-computing model. Thus, the components 802-818 of the metric compression system 106 may be implemented as a stand-alone application, such as a desktop or mobile application. Furthermore, the components 802-818 of the metric compression system 106 may be implemented as one or more web-based applications hosted on a remote server. Alternatively, or additionally, the components 802-818 of the metric compression system 106 may be implemented in a suite of mobile device applications or "apps."

Figure 9:
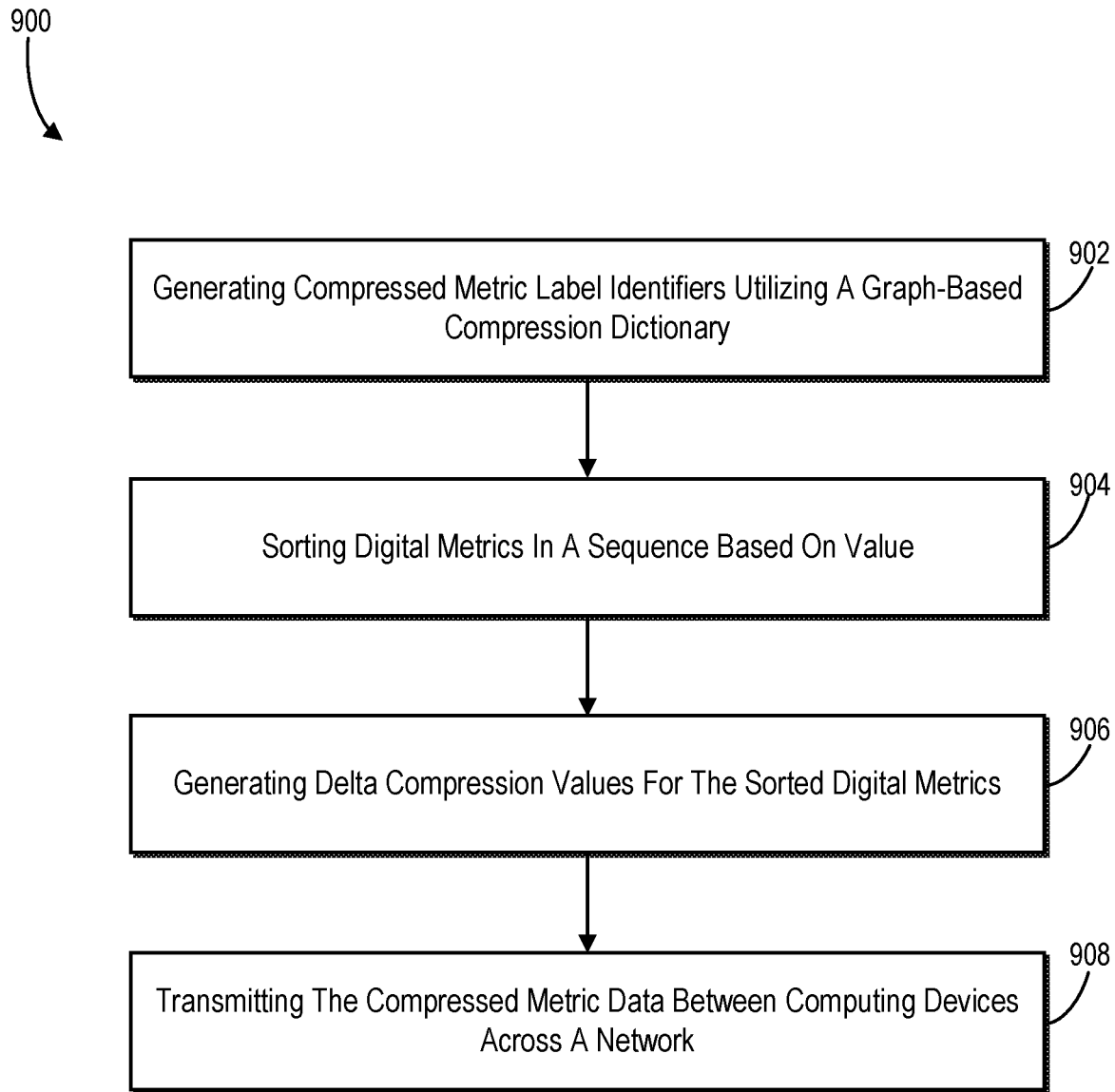
FIG. 9 illustrates a flowchart of a series of acts for generating compressed metric data for a set of digital metrics in accordance with one or more embodiments.

FIGS. 1-8, the corresponding text and the examples provide a number of different methods, systems, devices, and non-transitory computer-readable media of the metric compression system 106. In addition to the foregoing, one or more embodiments can also be described in terms of flowcharts comprising acts for accomplishing the particular result, as shown in FIG. 9. FIG. 9 may be performed with more or fewer acts. Further, the acts may be performed in different orders. Additionally, the acts described herein may be repeated or performed in parallel with one another or in parallel with different instances of the same or similar acts.

FIG. 9 illustrates a flowchart of a series of acts 900 for generating compressed metric data for a set of digital metrics in accordance with one or more embodiments. While FIG. 9 illustrates acts according to one embodiment, alternative embodiments may omit, add to, reorder, and/or modify any of the acts shown in FIG. 9. In some implementations, the acts of FIG. 9 are performed as part of a computer-implemented method. Alternatively, a non-transitory computer-readable medium can store instructions thereon that, when executed by at least one processor, cause a computing device to perform the acts of FIG. 9. In some embodiments, a system performs the acts of FIG. 9. For example, in one or more embodiments, a system includes at least one processor and a non-transitory computer-readable medium comprising instructions that, when executed by the at least one processor, cause the system to perform the acts of FIG. 9.

The series of acts 900 includes an act 902 for generating compressed metric label identifiers utilizing a graph-based compression dictionary. For example, in one or more embodiments, the act 902 involves generating a set of compressed metric data from a set of digital metrics comprising a plurality of metric values and a plurality of metric labels by generating, utilizing a graph-based compression dictionary shared between a first computing device and a second computing device, compressed metric label identifiers based on the plurality of metric labels.

In one or more embodiments, the graph-based compression dictionary comprises a plurality of nodes corresponding to metric label segments and a plurality of edges corresponding to metric label identifier values. In some implementations, generating the compressed metric label identifiers based on the plurality of metric labels and utilizing the graph-based compression dictionary comprises, for a metric label: traversing the plurality of nodes of the graph-based compression dictionary using segments of the metric label; determining one or more metric label identifier values corresponding to one or more edges between traversed nodes; and generating a compressed metric label identifier for the metric label using the one or more metric label identifier values.

In some cases, generating the compressed metric label identifiers based on the plurality of metric labels utilizing the graph-based compression dictionary comprises generating the compressed metric label identifiers based on the plurality of metric labels utilizing a finite-state transducer.

The series of acts 900 also includes an act 904 for sorting digital metrics in a sequence based on value. For instance, in some cases, the act 904 involves generating the set of compressed metric data from the set of digital metrics comprising the plurality of metric values and the plurality of metric labels by further sorting the set of digital metrics in a sequence based on the plurality of metric values.

Further, the series of acts 900 includes an act 906 of generating delta compression values for the sorted digital metrics. To illustrate, in some implementations, the act 906 involves generating the set of compressed metric data from the set of digital metrics comprising the plurality of metric values and the plurality of metric labels by further generating delta compression values according to the sequence using the sorted plurality of metric values.

In one or more embodiments, generating the delta compression values according to the sequence using the sorted plurality of metric values comprises: determining that a metric value and a preceding metric value from the sorted plurality of metric values include a same value; and generating a delta compression value for the metric value using a single bit of data to indicate that the metric value and the preceding metric value include the same value.

In some cases, generating the delta compression values according to the sequence using the sorted plurality of metric values comprises: determining a value difference between a metric value and a preceding metric value from the sorted plurality of metric values; and generating a delta compression value for the metric value to include a set of bits representing the value difference.

Additionally, the series of acts 900 includes an act 908 of transmitting the compressed metric data between computing devices across a network. For example, the act 908 can involve transmitting the set of compressed metric data comprising the compressed metric label identifiers and the delta compression values from the first computing device to the second computing device across a network.

In some embodiments, the series of acts 900 further includes acts for utilizing dictionary updates for modifying the graph-based compression dictionary. For example, in some implementations, the acts include receiving, at the first computing device, a dictionary update indicating at least one of a node or an edge to modify within the graph-based compression dictionary; and modifying, at the first computing device, the graph-based compression dictionary in accordance with the dictionary update. In some instances, the acts includes determining, at the first computing device, one or more metric labels currently unrepresented within the graph-based compression dictionary; generating, at the first computing device, a dictionary update indicating one or more nodes and one or more edges to add to the graph-based compression dictionary to represent the one or more metric labels; and transmitting the dictionary update to the second computing device.

In some instances, the series of acts 900 also includes acts for generating and compressing a metric blocklist. For instance, in some cases, the acts include generating, at the first computing device, a metric blocklist indicating a plurality of digital metrics that are to be withheld from transmission across the network; generating, at the first computing device, a compressed metric blocklist that includes a plurality of compressed metric label identifiers corresponding to the plurality of digital metrics; and transmitting the compressed metric blocklist from the first computing device to another computing device across the network.

In some cases, the series of acts 900 further includes acts for compressing digital metrics across a time window. For example, in one or more embodiments, the acts include generating an additional set of compressed metric data from an additional set of digital metrics comprising a set of metric values and a set of metric labels that span a window of time by: determining, utilizing the graph-based compression dictionary, additional compressed metric label identifiers based on the set of metric labels; generating a first set of delta compression values for the additional set of digital metrics by determining, for each digital metric, a value difference between pairs of metric values across the window of time; and generating a second set of delta compression values for the additional set of digital metrics by determining differences between pairs of delta compression values from the first set of delta compression values.

Embodiments of the present disclosure may comprise or utilize a special purpose or general-purpose computer including computer hardware, such as, for example, one or more processors and system memory, as discussed in greater detail below. Embodiments within the scope of the present disclosure also include physical and other computer-readable media for carrying or storing computer-executable instructions and/or data structures. In particular, one or more of the processes described herein may be implemented at least in part as instructions embodied in a non-transitory computer-readable medium and executable by one or more computing devices (e.g., any of the media content access devices described herein). In general, a processor (e.g., a microprocessor) receives instructions, from a non-transitory computer-readable medium, (e.g., a memory), and executes those instructions, thereby performing one or more processes, including one or more of the processes described herein.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, embodiments of the disclosure can comprise at least two distinctly different kinds of computer-readable media: non-transitory computer-readable storage media (devices) and transmission media.

Non-transitory computer-readable storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to non-transitory computer-readable storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that non-transitory computer-readable storage media (devices) can be included in computer system components that also (or even primarily) utilize transmission media.

Computer-executable instructions comprise, for example, instructions and data which, when executed by a processor, cause a general-purpose computer, special purpose computer, or special purpose processing device to perform a certain function or group of functions. In some embodiments, computer-executable instructions are executed on a general-purpose computer to turn the general-purpose computer into a special purpose computer implementing elements of the disclosure. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, personal computers, desktop computers, laptop computers, message processors, hand-held devices, multiprocessor systems, microprocessor-based or programmable consumer electronics, network PCs, minicomputers, mainframe computers, mobile telephones, PDAs, tablets, pagers, routers, switches, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Embodiments of the present disclosure can also be implemented in cloud computing environments. In this description, "cloud computing" is defined as a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly.

A cloud-computing model can be composed of various characteristics such as, for example, on-demand self-service, broad network access, resource pooling, rapid elasticity, measured service, and so forth. A cloud-computing model can also expose various service models, such as, for example, Software as a Service ("SaaS"), Platform as a Service ("PaaS"), and Infrastructure as a Service ("IaaS"). A cloud-computing model can also be deployed using different deployment models such as private cloud, community cloud, public cloud, hybrid cloud, and so forth. In this description and in the claims, a "cloud-computing environment" is an environment in which cloud computing is employed.

Figure 10:
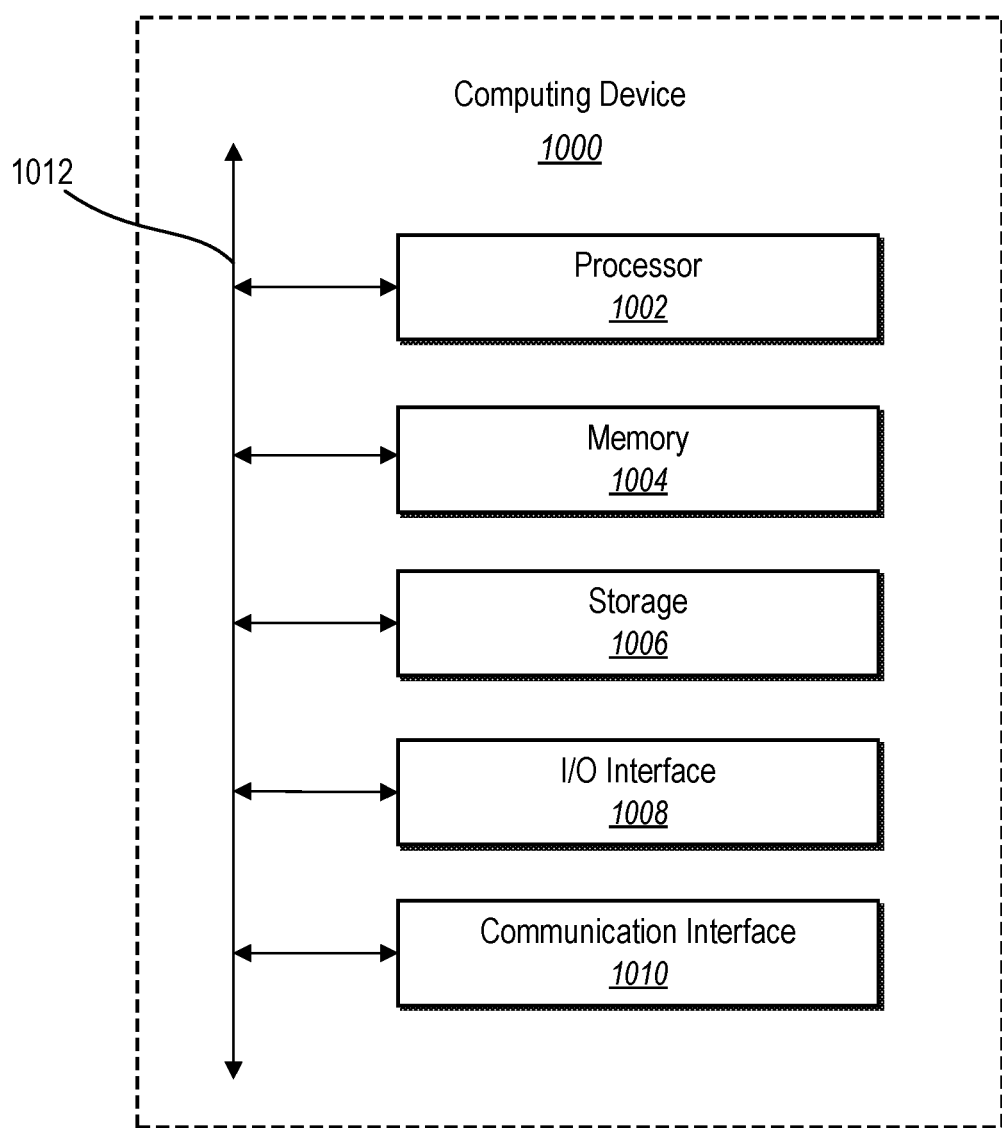
FIG. 10 illustrates a block diagram of an exemplary computing device in accordance with one or more embodiments.

FIG. 10 illustrates a block diagram of an example computing device 1000 that may be configured to perform one or more of the processes described above. One will appreciate that one or more computing devices, such as the computing device 1000 may represent the computing devices described above (e.g., the server(s) 102, the client devices 110a-110n, the metric storage server 112, and/or the web server 114). In one or more embodiments, the computing device 1000 may be a mobile device (e.g., a mobile telephone, a smartphone, a PDA, a tablet, a laptop, a camera, a tracker, a watch, a wearable device). In some embodiments, the computing device 1000 may be a non-mobile device (e.g., a desktop computer or another type of client device). Further, the computing device 1000 may be a server device that includes cloud-based processing and storage capabilities.

As shown in FIG. 10, the computing device 1000 can include one or more processor(s) 1002, memory 1004, a storage device 1006, input/output interfaces 1008 (or "I/O interfaces 1008"), and a communication interface 1010, which may be communicatively coupled by way of a communication infrastructure (e.g., bus 1012). While the computing device 1000 is shown in FIG. 10, the components illustrated in FIG. 10 are not intended to be limiting. Additional or alternative components may be used in other embodiments. Furthermore, in certain embodiments, the computing device 1000 includes fewer components than those shown in FIG. 10. Components of the computing device 1000 shown in FIG. 10 will now be described in additional detail.

In particular embodiments, the processor(s) 1002 includes hardware for executing instructions, such as those making up a computer program. As an example, and not by way of limitation, to execute instructions, the processor(s) 1002 may retrieve (or fetch) the instructions from an internal register, an internal cache, memory 1004, or a storage device 1006 and decode and execute them.

The computing device 1000 includes memory 1004, which is coupled to the processor(s) 1002. The memory 1004 may be used for storing data, metadata, and programs for execution by the processor(s). The memory 1004 may include one or more of volatile and non-volatile memories, such as Random-Access Memory ("RAM"), Read-Only Memory ("ROM"), a solid-state disk ("SSD"), Flash, Phase Change Memory ("PCM"), or other types of data storage. The memory 1004 may be internal or distributed memory.

The computing device 1000 includes a storage device 1006 including storage for storing data or instructions. As an example, and not by way of limitation, the storage device 1006 can include a non-transitory storage medium described above. The storage device 1006 may include a hard disk drive (HDD), flash memory, a Universal Serial Bus (USB) drive or a combination these or other storage devices.

As shown, the computing device 1000 includes one or more I/O interfaces 1008, which are provided to allow a user to provide input to (such as user strokes), receive output from, and otherwise transfer data to and from the computing device 1000. These I/O interfaces 1008 may include a mouse, keypad or a keyboard, a touch screen, camera, optical scanner, network interface, modem, other known I/O devices or a combination of such I/O interfaces 1008. The touch screen may be activated with a stylus or a finger.

The I/O interfaces 1008 may include one or more devices for presenting output to a user, including, but not limited to, a graphics engine, a display (e.g., a display screen), one or more output drivers (e.g., display drivers), one or more audio speakers, and one or more audio drivers. In certain embodiments, I/O interfaces 1008 are configured to provide graphical data to a display for presentation to a user. The graphical data may be representative of one or more graphical user interfaces and/or any other graphical content as may serve a particular implementation.

The computing device 1000 can further include a communication interface 1010. The communication interface 1010 can include hardware, software, or both. The communication interface 1010 provides one or more interfaces for communication (such as, for example, packet-based communication) between the computing device and one or more other computing devices or one or more networks. As an example, and not by way of limitation, communication interface 1010 may include a network interface controller (NIC) or network adapter for communicating with an Ethernet or other wire-based network or a wireless NIC (WNIC) or wireless adapter for communicating with a wireless network, such as a WI-FI. The computing device 1000 can further include a bus 1012. The bus 1012 can include hardware, software, or both that connects components of computing device 1000 to each other.

In one or more embodiments, the metric compression system 106 operates as part of a transportation matching system (e.g., the analytics system 104 is a system operating within a transportation matching system). Thus, the digital metrics compressed by the metric compression system 106 can include digital metrics related to the transportation matching services provided by the transportation matching system (e.g., ride times, pickup times, number of rides provided, etc.) as well as digital metrics related to performance of the transportation matching system (e.g., current CPU load, etc.). The metric compression system 106 can operate on one or more computing devices that participate in a network associated with the transportation matching system and can generate compressed metric data for transmission to other computing devices within the network.

Figure 11:
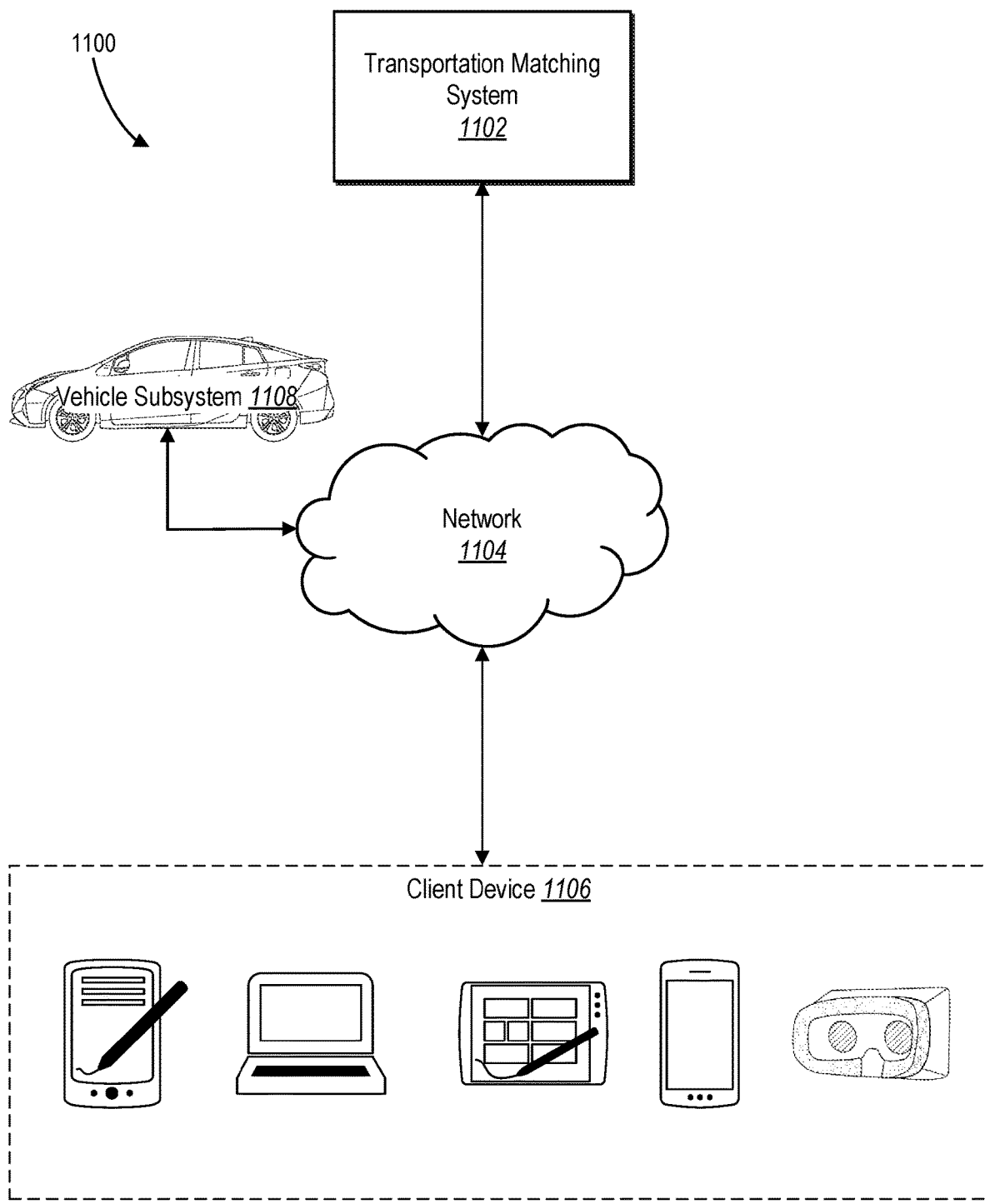
FIG. 11 illustrates an example environment for a transportation matching system in accordance with one or more embodiments.

FIG. 11 illustrates an example network environment 1100 of a transportation matching system 1102. The network environment 1100 includes a client device 1106, a transportation matching system 1102, and a vehicle subsystem 1108 connected to each other by a network 1104. Although FIG. 11 illustrates a particular arrangement of the client device 1106, transportation matching system 1102, vehicle subsystem 1108, and network 1104, this disclosure contemplates any suitable arrangement of client device 1106, transportation matching system 1102, vehicle subsystem 1108, and network 1104. As an example, and not by way of limitation, two or more of client device 1106, transportation matching system 1102, and vehicle subsystem 1108 communicate directly, bypassing network 1104. As another example, two or more of client device 1106, transportation matching system 1102, and vehicle subsystem 1108 may be physically or logically co-located with each other in whole or in part. Moreover, although FIG. 11 illustrates a particular number of client devices 1106, transportation matching systems 1102, vehicle subsystems 1108, and networks 1104, this disclosure contemplates any suitable number of client devices 1106, transportation matching systems 1102, vehicle subsystems 1108, and networks 1104. As an example, and not by way of limitation, network environment 1100 may include multiple client device 1106, transportation matching systems 1102, vehicle subsystems 1108, and networks 1104.

This disclosure contemplates any suitable network 1104. As an example, and not by way of limitation, one or more portions of network 1104 may include an ad hoc network, an intranet, an extranet, a virtual private network ("VPN"), a local area network ("LAN"), a wireless LAN ("WLAN"), a wide area network ("WAN"), a wireless WAN ("WWAN"), a metropolitan area network ("MAN"), a portion of the Internet, a portion of the Public Switched Telephone Network ("PSTN"), a cellular telephone network, or a combination of two or more of these. Network 1104 may include one or more networks 1104.

Links may connect client device 1106, transportation matching system 1102, and vehicle subsystem 1108 to network 1104 or to each other. This disclosure contemplates any suitable links. In particular embodiments, one or more links include one or more wireline (such as for example Digital Subscriber Line ("DSL") or Data Over Cable Service Interface Specification ("DOC SIS"), wireless (such as for example Wi-Fi or Worldwide Interoperability for Microwave Access ("WiMAX"), or optical (such as for example Synchronous Optical Network ("SONET") or Synchronous Digital Hierarchy ("SDH") links. In particular embodiments, one or more links each include an ad hoc network, an intranet, an extranet, a VPN, a LAN, a WLAN, a WAN, a WWAN, a MAN, a portion of the Internet, a portion of the PSTN, a cellular technology-based network, a satellite communications technology-based network, another link, or a combination of two or more such links. Links need not necessarily be the same throughout network environment 1100. One or more first links may differ in one or more respects from one or more second links.

In particular embodiments, client device 1106 may be an electronic device including hardware, software, or embedded logic components or a combination of two or more such components and capable of carrying out the appropriate functionalities implemented or supported by client device 1106. As an example, and not by way of limitation, a client device 1106 may include any of the computing devices discussed above in relation to FIG. 10. A client device 1106 may enable a network user at client device 1106 to access network 1104. A client device 1106 may enable its user to communicate with other users at other client devices 1106.

In particular embodiments, client device 1106 may include a requester application or a web browser, such as MICROSOFT INTERNET EXPLORER, GOOGLE CHROME or MOZILLA FIREFOX, and may have one or more add-ons, plug-ins, or other extensions, such as TOOL-BAR or YAHOO TOOLBAR. A user at client device 1106 may enter a Uniform Resource Locator ("URL") or other address directing the web browser to a particular server (such as server), and the web browser may generate a Hyper Text Transfer Protocol ("HTTP") request and communicate the HTTP request to server. The server may accept the HTTP request and communicate to client device 1106 one or more Hyper Text Markup Language ("HTML") files responsive to the HTTP request. Client device 1106 may render a webpage based on the HTML files from the server for presentation to the user. This disclosure contemplates any suitable webpage files. As an example, and not by way of limitation, webpages may render from HTML files, Extensible Hyper Text Markup Language ("XHTML") files, or Extensible Markup Language ("XML") files, according to particular needs. Such pages may also execute scripts such as, for example and without limitation, those written in JAVASCRIPT, JAVA, MICROSOFT SILVERLIGHT, combinations of markup language and scripts such as AJAX (Asynchronous JAVASCRIPT and XML), and the like. Herein, reference to a webpage encompasses one or more corresponding webpage files (which a browser may use to render the webpage) and vice versa, where appropriate.

In particular embodiments, transportation matching system 1102 may be a network-addressable computing system that can host a transportation matching network. Transportation matching system 1102 may generate, store, receive, and send data, such as, for example, user-profile data, concept-profile data, text data, transportation request data, GPS location data, provider data, requester data, vehicle data, or other suitable data related to the transportation matching network. This may include authenticating the identity of providers and/or vehicles who are authorized to provide transportation services through the transportation matching system 1102. In addition, the transportation matching system may manage identities of service requesters such as users/requesters. In particular, the transportation matching system 1102 may maintain requester data such as driving/riding histories, personal data, or other user data in addition to navigation and/or traffic management services or other location services (e.g., GPS services).

In particular embodiments, the transportation matching system 1102 may manage transportation matching services to connect a user/requester with a vehicle and/or provider. By managing the transportation matching services, the transportation matching system 1102 can manage the distribution and allocation of resources from the vehicle subsystem 1108 and user resources such as GPS location and availability indicators, as described herein.

Transportation matching system 1102 may be accessed by the other components of network environment 1100 either directly or via network 1104. In particular embodiments, transportation matching system 1102 may include one or more servers. Each server may be a unitary server or a distributed server spanning multiple computers or multiple datacenters. Servers may be of various types, such as, for example and without limitation, web server, news server, mail server, message server, advertising server, file server, application server, exchange server, database server, proxy server, another server suitable for performing functions or processes described herein, or any combination thereof. In particular embodiments, each server may include hardware, software, or embedded logic components or a combination of two or more such components for carrying out the appropriate functionalities implemented or supported by server. In particular embodiments, transportation matching system 1102 may include one or more data stores. Data stores may be used to store various types of information. In particular embodiments, the information stored in data stores may be organized according to specific data structures. In particular embodiments, each data store may be a relational, columnar, correlation, or other suitable database. Although this disclosure describes or illustrates particular types of databases, this disclosure contemplates any suitable types of databases. Particular embodiments may provide interfaces that enable a client device 1106, or a transportation matching system 1102 to manage, retrieve, modify, add, or delete, the information stored in data store.

In particular embodiments, transportation matching system 1102 may provide users with the ability to take actions on various types of items or objects, supported by transportation matching system 1102. As an example, and not by way of limitation, the items and objects may include transportation matching networks to which users of transportation matching system 1102 may belong, vehicles that users may request, location designators, computer-based applications that a user may use, transactions that allow users to buy or sell items via the service, interactions with advertisements that a user may perform, or other suitable items or objects. A user may interact with anything that is capable of being represented in transportation matching system 1102 or by an external system of a third-party system, which is separate from transportation matching system 1102 and coupled to transportation matching system 1102 via a network 1104.

In particular embodiments, transportation matching system 1102 may be capable of linking a variety of entities. As an example, and not by way of limitation, transportation matching system 1102 may enable users to interact with each other or other entities, or to allow users to interact with these entities through an application programming interfaces ("API") or other communication channels.

In particular embodiments, transportation matching system 1102 may include a variety of servers, sub-systems, programs, modules, logs, and data stores. In particular embodiments, transportation matching system 1102 may include one or more of the following: a web server, action logger, API-request server, relevance-and-ranking engine, content-object classifier, notification controller, action log, third-party-content-object-exposure log, inference module, authorization/privacy server, search module, advertisement-targeting module, user-interface module, user-profile store, connection store, third-party content store, or location store. Transportation matching system 1102 may also include suitable components such as network interfaces, security mechanisms, load balancers, failover servers, management-and-network-operations consoles, other suitable components, or any suitable combination thereof. In particular embodiments, transportation matching system 1102 may include one or more user-profile stores for storing user profiles. A user profile may include, for example, biographic information, demographic information, behavioral information, social information, or other types of descriptive information, such as work experience, educational history, hobbies or preferences, interests, affinities, or location.

The web server may include a mail server or other messaging functionality for receiving and routing messages between transportation matching system 1102 and one or more client devices 1106. An action logger may be used to receive communications from a web server about a user's actions on or off transportation matching system 1102. In conjunction with the action log, a third-party-content-object log may be maintained of user exposures to third-party-content objects. A notification controller may provide information regarding content objects to a client device 1106. Information may be pushed to a client device 1106 as notifications, or information may be pulled from client device 1106 responsive to a request received from client device 1106. Authorization servers may be used to enforce one or more privacy settings of the users of transportation matching system 1102. A privacy setting of a user determines how particular information associated with a user can be shared. The authorization server may allow users to opt in to or opt out of having their actions logged by transportation matching system 1102 or shared with other systems, such as, for example, by setting appropriate privacy settings. Third-party-content-object stores may be used to store content objects received from third parties. Location stores may be used for storing location information received from client devices 1106 associated with users.

In addition, the vehicle subsystem 1108 can include a human-operated vehicle or an autonomous vehicle. A provider of a human-operated vehicle can perform maneuvers to pick up, transport, and drop off one or more requesters according to the embodiments described herein. In certain embodiments, the vehicle subsystem 1108 can include an autonomous vehicle—i.e., a vehicle that does not require a human operator. In these embodiments, the vehicle subsystem 1108 can perform maneuvers, communicate, and otherwise function without the aid of a human provider, in accordance with available technology.

In particular embodiments, the vehicle subsystem 1108 may include one or more sensors incorporated therein or associated thereto. For example, sensor(s) can be mounted on the top of the vehicle subsystem 1108 or else can be located within the interior of the vehicle subsystem 1108. In certain embodiments, the sensor(s) can be located in multiple areas at once—i.e., split up throughout the vehicle subsystem 1108 so that different components of the sensor(s) can be placed in different locations in accordance with optimal operation of the sensor(s). In these embodiments, the sensor(s) can include a LIDAR sensor and an inertial measurement unit ("IMU") including one or more accelerometers, one or more gyroscopes, and one or more magnetometers. The sensor(s) can additionally or alternatively include a wireless IMU ("WIMU"), one or more cameras, one or more microphones, or other sensors or data input devices capable of receiving and/or recording information relating to navigating a route to pick up, transport, and/or drop off a requester.

In particular embodiments, the vehicle subsystem 1108 may include a communication device capable of communicating with the client device 1106 and/or the transportation matching system 1102. For example, the vehicle subsystem 1108 can include an on-board computing device communicatively linked to the network 1104 to transmit and receive data such as GPS location information, sensor-related information, requester location information, or other relevant information.

In the foregoing specification, the invention has been described with reference to specific exemplary embodiments thereof. Various embodiments and aspects of the invention(s) are described with reference to details discussed herein, and the accompanying drawings illustrate the various embodiments. The description above and drawings are illustrative of the invention and are not to be construed as limiting the invention. Numerous specific details are described to provide a thorough understanding of various embodiments of the present invention.

The present invention may be embodied in other specific forms without departing from its spirit or essential characteristics. The described embodiments are to be considered in all respects only as illustrative and not restrictive. For example, the methods described herein may be performed with less or more steps/acts or the steps/acts may be performed in differing orders. Additionally, the steps/acts described herein may be repeated or performed in parallel with one another or in parallel with different instances of the same or similar steps/acts. The scope of the invention is, therefore, indicated by the appended claims rather than by the foregoing description. All changes that come within the meaning and range of equivalency of the claims are to be embraced within their scope.

What is claimed is:

1. A computer-implemented method comprising:
generating a set of compressed digital data from a set of key-value pairs comprising key labels and values by:
generating, utilizing a graph-based compression dictionary shared between a first computing device and a second computing device, compressed label identifiers based on the key labels;
determining a sorted value sequence from the key-value pairs by sorting the key-value pairs according to the values; and
generating delta compression values from the values utilizing the sorted value sequence; and
transmitting the set of compressed digital data comprising the compressed label identifiers and the delta compression values from the first computing device to the second computing device across a network.

2. The computer-implemented method of claim 1, wherein transmitting the set of compressed digital data further comprises:
identifying a key label, from the key labels, unrepresented within the graph-based compression dictionary; and
transmitting a dictionary update to the graph-based compression dictionary between from the first computing device to the second computing device with the set of compressed digital data.

3. The computer-implemented method of claim 2, wherein the graph-based compression dictionary comprises a plurality of nodes corresponding to key label segments and a plurality of edges corresponding to label identifier values.

4. The computer-implemented method of claim 3, wherein transmitting the dictionary update comprises transmitting at least one of a node or an edge corresponding to the key label to modify within the graph-based compression dictionary.

5. The computer-implemented method of claim 1, wherein generating the compressed label identifiers based on the key labels and utilizing the graph-based compression dictionary comprises, for a particular key label:
traversing a plurality of nodes of the graph-based compression dictionary using segments of the particular key label; and
generating a compressed label identifier for the particular key label using one or more label identifier values corresponding to one or more edges between the plurality of nodes.

6. The computer-implemented method of claim 1, wherein generating the compressed label identifiers based on the key labels and utilizing the graph-based compression dictionary comprises generating the compressed label identifiers based on the key labels utilizing a finite-state transducer.

7. The computer-implemented method of claim 1, wherein generating the delta compression values from the values utilizing the sorted value sequence comprises:

determining that a first key value and a first preceding key value from the sorted value sequence include a same value;
generating a first delta compression value indicating that the first key value and the first preceding key value include the same value;
determining a value difference between a second key value and a second preceding key value from the sorted value sequence; and
generating a second delta compression value representing the value difference.

8. The computer-implemented method of claim 1, further comprising:
generating, at the first computing device, a metric blocklist indicating key-value pairs to be withheld from transmission across the network;
generating, at the first computing device, a compressed metric blocklist; and
transmitting the compressed metric blocklist from the first computing device to another computing device across the network.

9. A non-transitory computer-readable medium storing program instructions thereon that, when executed by at least one processor, cause a computing device system to:
generate a set of compressed digital data from a set of key-value pairs comprising key labels and values by:
generating, utilizing a graph-based compression dictionary shared between a first computing device and a second computing device, compressed label identifiers based on the key labels;
determining a sorted value sequence from the key-value pairs by sorting the key-value pairs according to the values; and
generating delta compression values from the values utilizing the sorted value sequence; and
cause the set of compressed digital data comprising the compressed label identifiers and the delta compression values to be transmitted from the first computing device to the second computing device across a network.

10. The non-transitory computer-readable medium of claim 9, wherein the program instructions that cause the computing system to cause the set of compressed digital data to be transmitted from the first computing device to the second device comprise program instructions that, when executed by the at least one processor, cause the computing system to:
identify a key label, from the key labels, unrepresented within the graph-based compression dictionary; and
cause a dictionary update to the graph-based compression dictionary to be transmitted from the first computing device to the second computing device with the set of compressed digital data.

11. The non-transitory computer-readable medium of claim 10, wherein the graph-based compression dictionary comprises a plurality of nodes corresponding to key label segments and a plurality of edges corresponding to label identifier values, and wherein the program instructions that cause the computing system to cause the dictionary update to be transmitted from the first computing device to the second computing device comprise program instructions that, when executed by the at least one processor, cause the computing system to cause at least one of a node or an edge corresponding to the key label to be transmitted from the first computing device to the second computing device to modify within the graph-based compression dictionary.

12. The non-transitory computer-readable medium of claim 9, wherein the program instructions that cause the computing system to generate the compressed label identifiers based on the key labels and utilizing the graph-based compression dictionary comprise program instructions that, when executed by the at least one processor, cause the computing system to, for a particular key label:
traverse a plurality of nodes of the graph-based compression dictionary using segments of the particular key label; and
generate a compressed label identifier for the particular key label using one or more label identifier values corresponding to one or more edges between the plurality of nodes.

13. The non-transitory computer-readable medium of claim 9, wherein the program instructions that cause the computing system to generate the compressed label identifiers based on the key labels utilizing the graph-based compression dictionary comprise program instructions that, when executed by the at least one processor, cause the computing system to generate the compressed label identifiers based on the key labels utilizing a finite-state transducer.

14. The non-transitory computer-readable medium of claim 9, wherein the program instructions that cause the computing system to generate the delta compression values from the values utilizing the sorted value sequence comprise program instructions that, when executed by the at least one processor, cause the computing system to:
determine that a first key value and a first preceding key value from the sorted value sequence include a same value;
generate a first delta compression value indicating that the first key value and the first preceding key value include the same value;
determine a value difference between a second key value and a second preceding key value from the sorted value sequence; and
generate a second delta compression value representing the value difference.

15. A computing system comprising:
at least one processor;
at least one non-transitory computer-readable medium; and
program instructions stored on the at least one non-transitory computer-readable medium that, when executed by the at least one processor, cause the computing system to:
generate a set of compressed digital data from a set of key-value pairs comprising key labels and values by:
generating, utilizing a graph-based compression dictionary shared between a first computing device and a second computing device, compressed label identifiers based on the key labels;
determining a sorted value sequence from the key-value pairs by sorting the key-value pairs according to the values; and
generating delta compression values from the values utilizing the sorted value sequence; and
cause the set of compressed digital data comprising the compressed label identifiers and the delta compression values to be transmitted from the first computing device to the second computing device across a network.

16. The computing system of claim 15, wherein the program instructions that cause the computing system to cause the set of compressed digital data to be transmitted from the first computing device to the second computing device comprise program instruction that, when executed by the at least one processor, cause the computing system to:

identify a key label, from the key labels, unrepresented within the graph-based compression dictionary; and cause a dictionary update to the graph-based compression dictionary to be transmitted from the first computing device to the second computing device with the set of compressed digital data.

17. The computing system of claim 16, wherein the graph-based compression dictionary comprises a plurality of nodes corresponding to key label segments and a plurality of edges corresponding to label identifier values, and wherein the program instructions that cause the computing system to cause the dictionary update to be transmitted from the first computing device to the second computing device comprise program instructions that, when executed by the at least one processor, cause the computing system to cause at least one of a node or an edge corresponding to the key label to be transmitted from the first computing device to the second computing device to modify within the graph-based compression dictionary.

18. The computing system of claim 15, wherein the program instructions that cause the computing system to generate the compressed label identifiers based on the key labels and utilizing the graph-based compression dictionary comprise program instructions that, when executed by the at least one processor, cause the computing system to, for a particular key label:

traverse a plurality of nodes of the graph-based compression dictionary using segments of the particular key label; and generate a compressed label identifier for the particular key label using one or more label identifier values corresponding to one or more edges between the plurality of nodes.

19. The computing system of claim 15, wherein the program instructions that cause the computing system to generate the compressed label identifiers based on the key labels utilizing the graph-based compression dictionary comprise program instructions that, when executed by the at least one processor, cause the computing system to generate the compressed label identifiers based on the key labels utilizing a finite-state transducer.

20. The computing system of claim 15, wherein the program instructions that cause the computing system to generate the delta compression values from the values utilizing the sorted value sequence comprise program instructions that, when executed by the at least one processor, cause the computing system to:

determine that a first key value and a first preceding key value from the sorted value sequence include a same value;

generate a first delta compression value indicating that the first key value and the first preceding key value include the same value;

determine a value difference between a second key value and a second preceding key value from the sorted value sequence; and generate a second delta compression value representing the value difference.

* * * * *